United States Patent
Katzir et al.

(10) Patent No.: US 7,092,000 B2
(45) Date of Patent: Aug. 15, 2006

(54) PULSE LIGHT PATTERN WRITER

(75) Inventors: Yigal Katzir, Rishon-Lezion (IL); Boris Kling, Rehovet (IL); Avraham Gross, Ramal-Aviv (IL); Wolfgang Retschke, Jena (DE)

(73) Assignee: Orbotech Ltd., Yavne (IL)

( * ) Notice: Subject to any disclaimer, the term of this patent is extended or adjusted under 35 U.S.C. 154(b) by 0 days.

(21) Appl. No.: 09/735,872

(22) Filed: Dec. 13, 2000

(65) Prior Publication Data

US 2001/0010536 A1    Aug. 2, 2001

(30) Foreign Application Priority Data

Jan. 5, 2000  (IL) ........................ 133889

(51) Int. Cl.
*B41J 2/47*      (2006.01)
(52) U.S. Cl. ..................................... 347/255
(58) Field of Classification Search ............... 347/255, 347/239, 225; 372/22, 25, 26, 28
See application file for complete search history.

(56) References Cited

U.S. PATENT DOCUMENTS

| | | |
|---|---|---|
| 3,447,856 A | 6/1969 | De Lange |
| 4,044,363 A | 8/1977 | Morgan |
| 4,180,822 A | 12/1979 | Hudson et al. |
| 4,201,455 A * | 5/1980 | Vadasz et al. ............. 359/286 |
| 4,205,348 A | 5/1980 | DeBenedictis et al. |
| 4,213,158 A | 7/1980 | DeBenedictis |
| 4,307,409 A | 12/1981 | Greenig et al. |
| 4,321,564 A | 3/1982 | Tregay |
| 4,577,932 A | 3/1986 | Gelbart |
| 4,819,033 A | 4/1989 | Yoshitake et al. |
| 4,883,352 A | 11/1989 | Bruning |
| 4,912,487 A | 3/1990 | Porter et al. |
| 4,918,462 A | 4/1990 | Tomita et al. |
| 4,947,047 A | 8/1990 | Muraki ................... 250/492.2 |
| 4,947,186 A | 8/1990 | Calloway et al. |
| 4,947,947 A | 8/1990 | White |
| 5,041,716 A | 8/1991 | Wakabayashi |
| 5,255,051 A | 10/1993 | Allen |
| 5,264,872 A | 11/1993 | Wong |
| 5,309,178 A | 5/1994 | Gross |
| 5,311,321 A | 5/1994 | Crowley |
| 5,327,338 A | 7/1994 | Allen et al. |
| 5,328,811 A | 7/1994 | Brestel |
| 5,339,737 A | 8/1994 | Lewis et al. |
| 5,353,705 A | 10/1994 | Lewis et al. |
| 5,377,212 A | 12/1994 | Tatsuno et al. |
| 5,386,221 A | 1/1995 | Allen et al. |

(Continued)

FOREIGN PATENT DOCUMENTS

EP    0 173 617 A1    3/1986

(Continued)

OTHER PUBLICATIONS

Gelbert, D.; "High Power Multi-Channel Writing Heads"; IS&T's 47th Annual Conference; ICPS; pp. 608-611; 1994.

(Continued)

*Primary Examiner*—Michael Nghiem
(74) *Attorney, Agent, or Firm*—Sughrue Mion, PLLC

(57) ABSTRACT

Apparatus far transmitting information at a data rate, such as for recording an image on a photosensitive surface, including a pulsed light source that produces pulsed light having a pulsed repetition rate and a modulator that asynchronously modulates the pulsed light at the data rate, wherein the data rate is higher than pulse repetition rate.

6 Claims, 16 Drawing Sheets

U.S. PATENT DOCUMENTS

| | | | |
|---|---|---|---|
| 5,426,433 | A | 6/1995 | Gertel |
| 5,462,433 | A | 10/1995 | Benck et al. |
| 5,479,238 | A | 12/1995 | Whitney |
| 5,574,537 | A | 11/1996 | Ozawa |
| 5,625,403 | A | 4/1997 | Hazman |
| 5,673,134 | A | 9/1997 | Oka et al. |
| 5,745,284 | A | 4/1998 | Goldberg et al. |
| 5,783,356 | A | 7/1998 | Bosschaerts et al. |
| 5,796,112 | A | 8/1998 | Ichie |
| 6,037,967 | A | 3/2000 | Allen et al. |
| 6,246,706 | B1 | 6/2001 | Kafka et al. |
| 6,275,514 | B1 | 8/2001 | Katzir et al. ............... 372/25 |
| 6,421,573 | B1 | 7/2002 | Kafka et al. |
| 6,477,188 | B1 * | 11/2002 | Takaoka et al. ............. 372/22 |
| 6,560,248 | B1 | 5/2003 | Vernackt |
| 6,574,255 | B1 * | 6/2003 | Caprara et al. ............. 372/45 |
| 6,765,934 | B1 * | 7/2004 | Gross ........................ 372/25 |
| 6,770,866 | B1 * | 8/2004 | Retschke et al. ........... 250/235 |

FOREIGN PATENT DOCUMENTS

| | | |
|---|---|---|
| EP | 0 844 530 | 5/1998 |
| GB | 2 245 790 A | 1/1992 |
| JP | 6-235944 | 8/1994 |
| WO | WO 94/09989 A1 | 5/1994 |
| WO | WO 00/02424 A1 | 1/2000 |
| WO | WO 00/11766 A1 | 3/2000 |

OTHER PUBLICATIONS

Goldberg, L. et al.; "Deep-UV Generation by Frequency Quadrupling of a Power GaAlAs Semiconductor Laser"; Optics Letters, vol. 20; No. 10; pp. 1145-1147; May 15, 1995.

Hare, D. E. et al.; "Fundamental Mechanisms of Lithographic Printing Plate Imaging by Near-Infrared Laser"; Journal of Imaging Science and Technology; vol. 41; No. 3; pp. 291-300; May-Jun., 1997.

Lowry, J. B. et al.; "Pulse Scophony Laser Projection System"; Optics and Laser Technology; vol. 20; No. 5; pp. 255-258; Oct. 1988.

Maydan, D.; "Micromachining and Image Recording on Thin Films by Laser Beams"; The Hill System Technical Journal; pp. 1761-1789; Jul.-Aug. 1971.

Tison, J. K.; "Highly Accurate Pattern Generation Using Acousto-Optical Deflection"; SPIE, vol. 1463; Optical Laser Microlithography IV; pp. 629-637; 1991.

Ulrich, H. et al.; "Direct Writing Laser Lithography for Production of Microstructures"; Microelectronic Engineering; vol. 6; pp. 77-84; 1987.

Decker, C. et al.; "Recent Advances in UV-Curing Chemistry;" Apr. 1993; pp. 49-57; Journal of Coatings Technology; vol. 65, No. 819.

Graves, D. W.; "64 Channel Acousto-Optical Bragg Cells for Optical Computing Applications;"Year 1991; pp. 229-235 Optical EnhancementsComputingTechnology;SPIE vol. 1563.

Herzog, D. G.; "Description of a Dry Film Tactical Laser Beam Recorder," May/Jun. 1981; pp. 335-343; Optical Engineering; vol. 20, No. 3.

Johnson, R. V. et al.; "Scophony Spatial Light Modulator;" Jan./Feb. 1985; pp. 93-100; Optical Engineering; vol. 24, No. 1.

Kenville, R. F.; "Fifteen Years of Laser Recording—Where We've Been and Where We're Going;" May/Jun. 1981; pp. 330-334; Optical Engineering; vol. 20, No. 3.

Pierson, P. B.; "Design Considerationsfor a Flexible High-Resolution Film Recording System;" May/Jun. 1981; pp. 344-350; Optical Engineering; vol. 20, No. 3.

Sanders, D. J.; "Temperature Distributions Produced by Scanning Gaussian Laser Beams;" Jan. 1, 1984; pp. 30-35; Applied Optics; vol. 23; No. 1.

IBM Technical Disclosure Bulletin; "Laser Induced Silicon Etching with Nano-Second Pulsed Laser At/Below Visible Wavelength;" Jan. 1986; p. 1 of 1; http://www.patents.ibm.com/tdbs/tdb?&order=86A+60238.

IBM Technical Disclosure Bulletin; "High Speed Laser Printer;" Aug. 1971; p. 1 of 1; http://www.patents.ibm.com/tdbs/tdb?&order=71C+01893.

IBM Technical Disclosure Bulletin; "Direct Patterning with a Pulsed Deposition Source;" Jul. 1992; pp. 1-2; http://www.patents.ibm.com/tdbs/tdb?&order=92A+61911.

Tidwell, S. C. et al.; "Efficent High-Power UV Generation by Use of a Resonant Ring Driven by a CW Model-Locked IR Laser," Sep. 15, 1993; pp. 1517-1519; Optics Letters; vol. 18, No. 18.

Decker, C. et al.; "Light Fastness of UV Absorbers in Radiation-Cured Acrylic Coatings;" 1993; Polymeric Materials Science and Engineering; vol. 68; pp. 70-71.

Decker, C. et al.; "Kinetic Study of Ultrafast PhotopolymerizationReaction"; 1996; J.M.S.—Pure Appl. Chem.; A33(2); pp. 173-190.

* cited by examiner

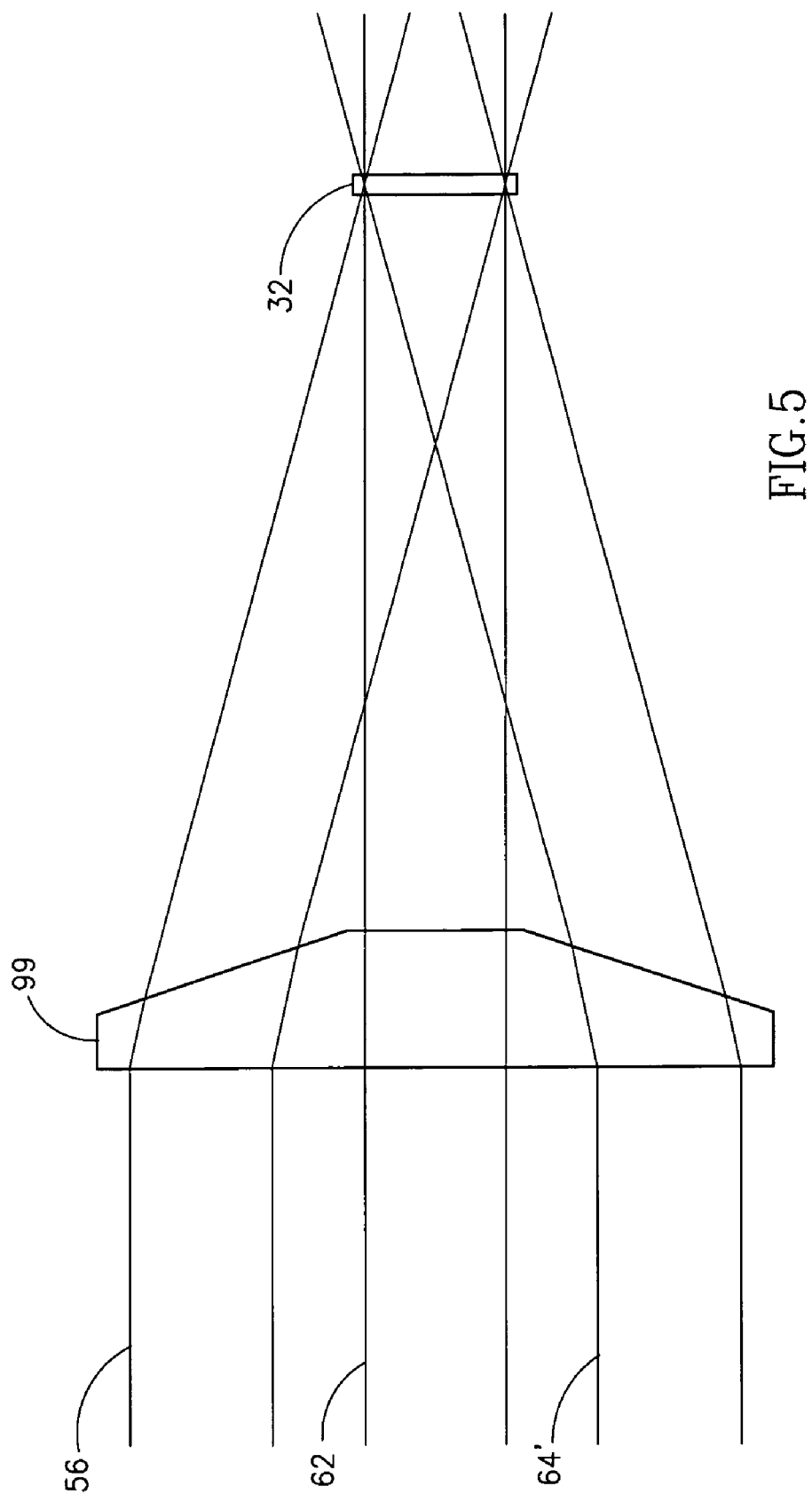

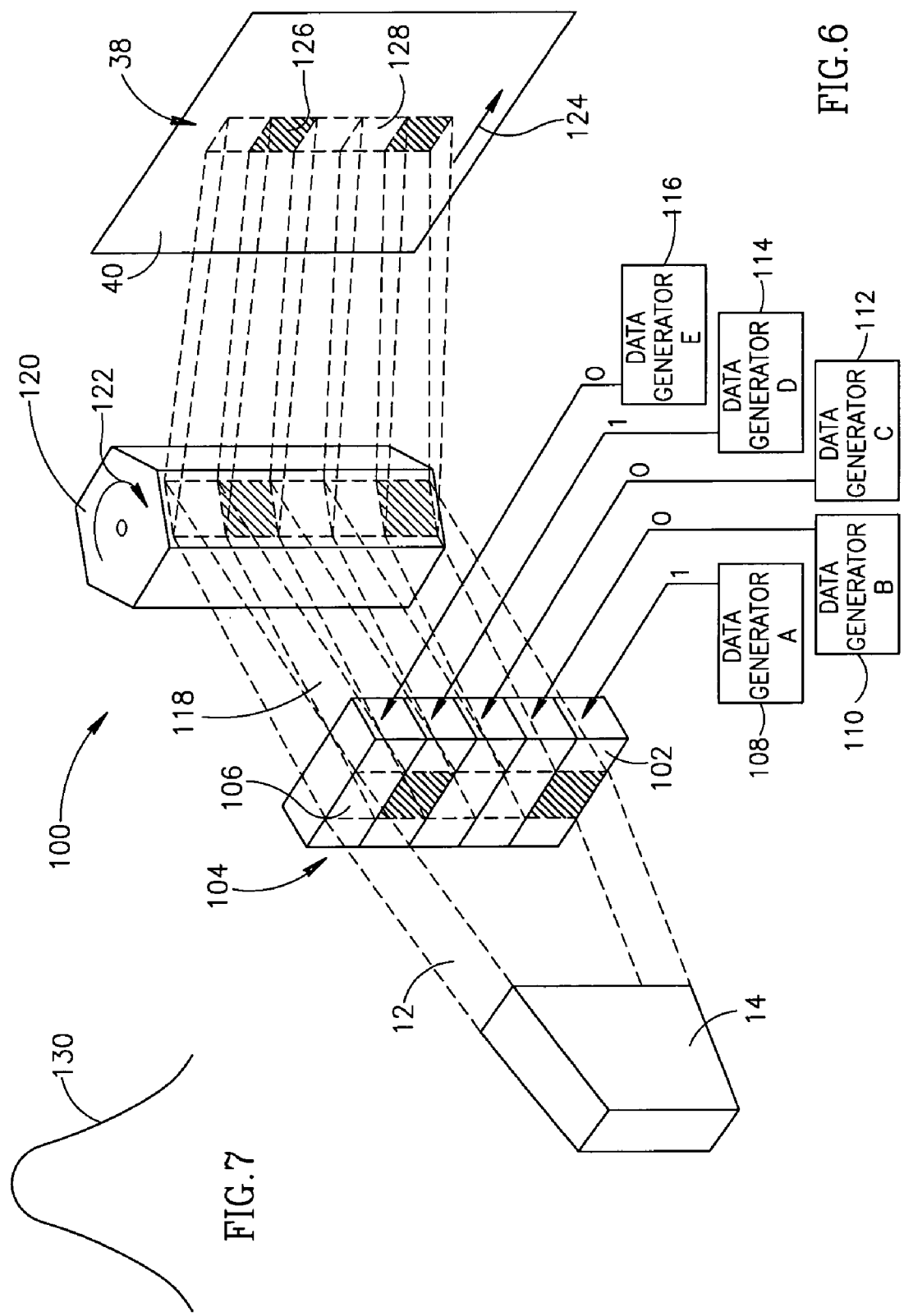

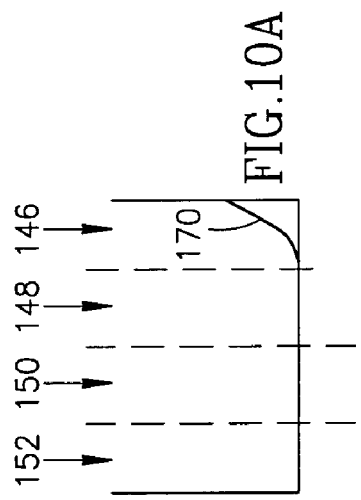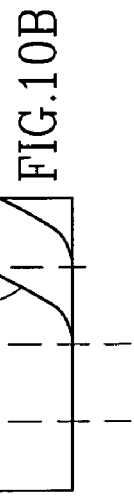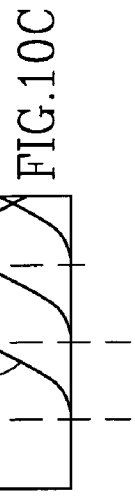
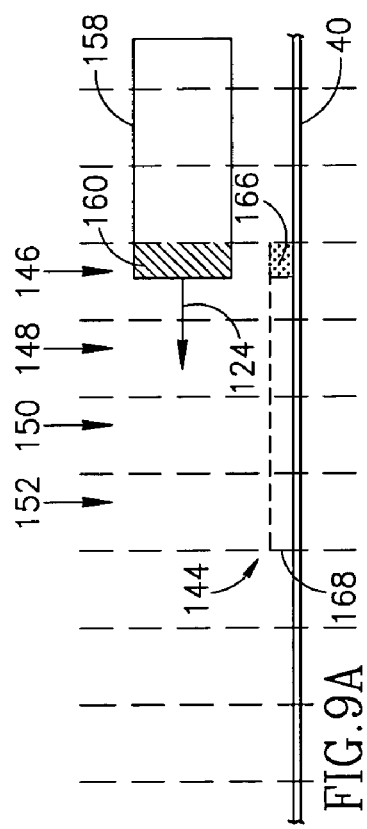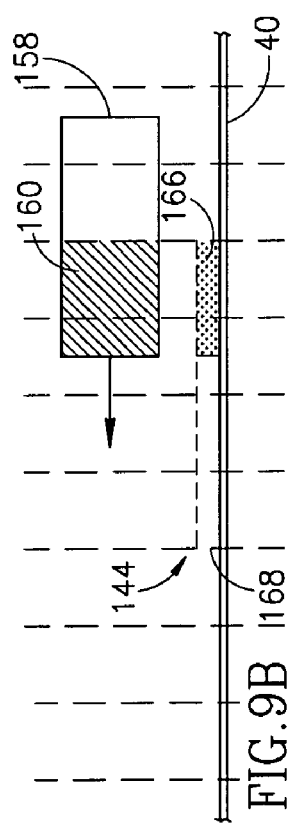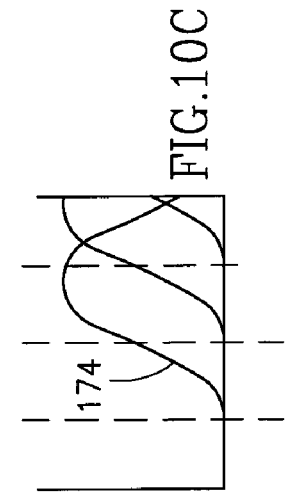
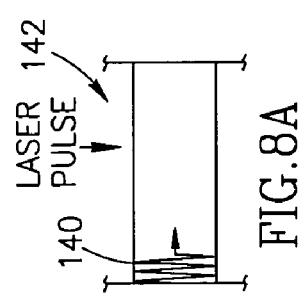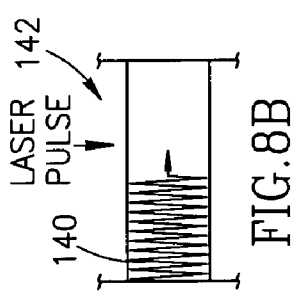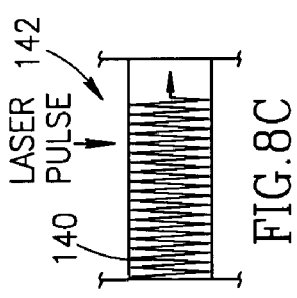

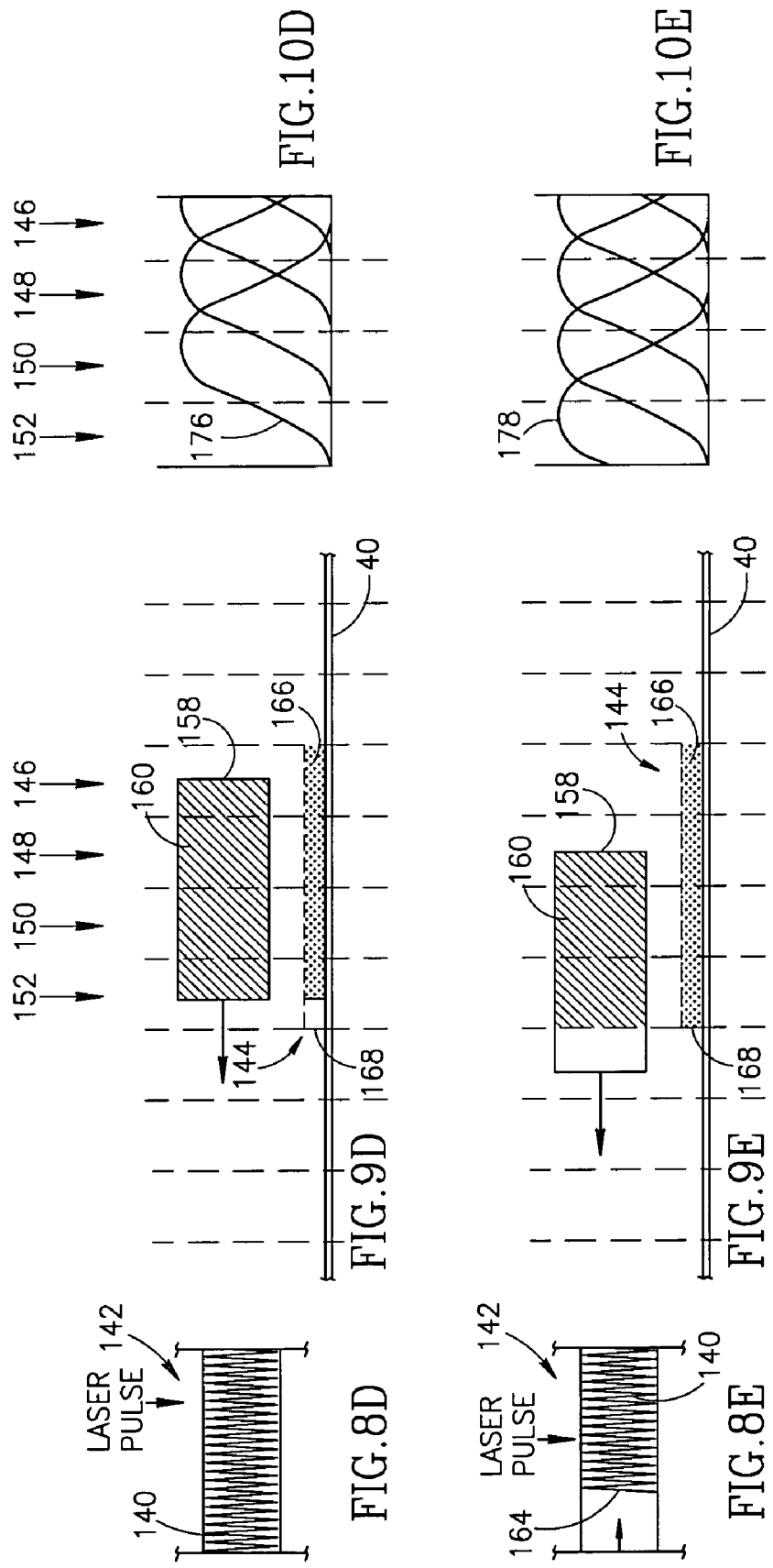

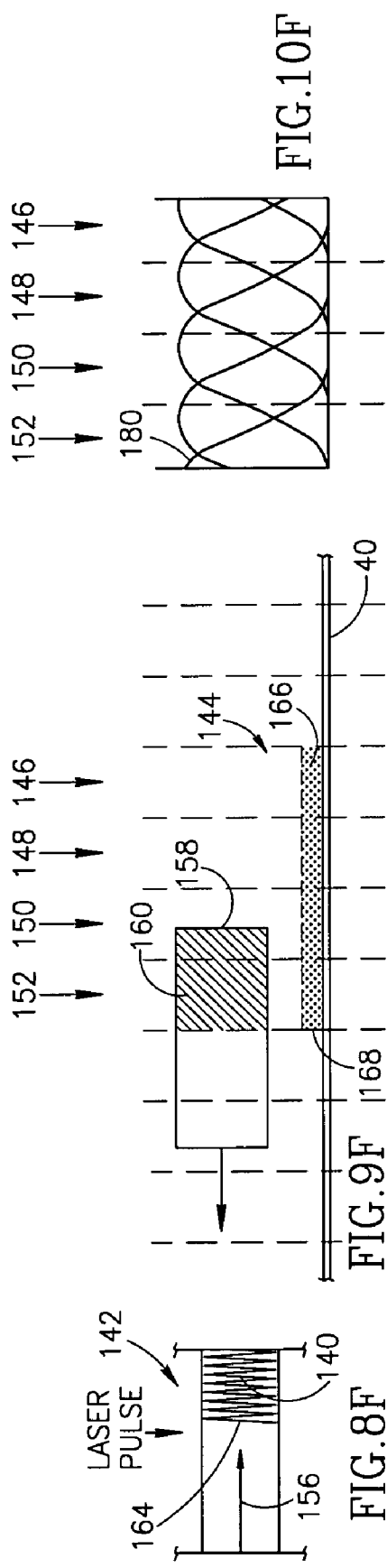
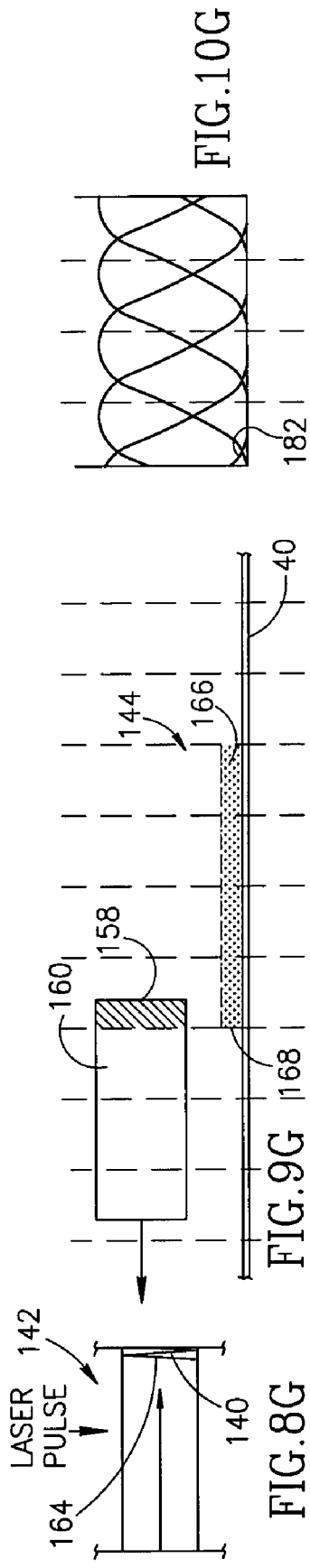

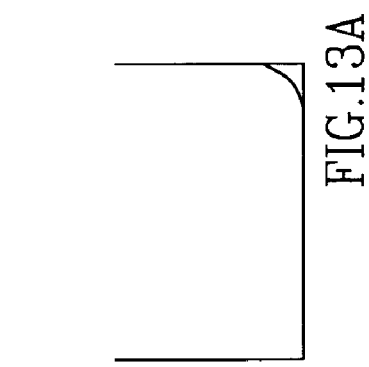
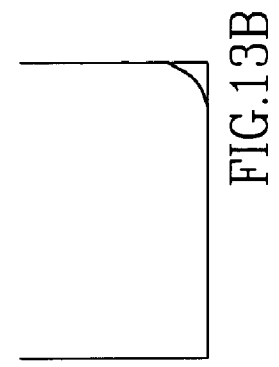
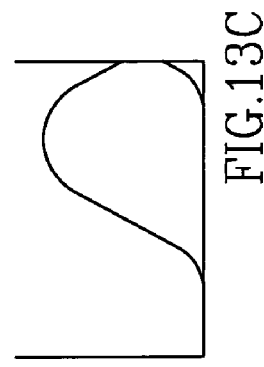
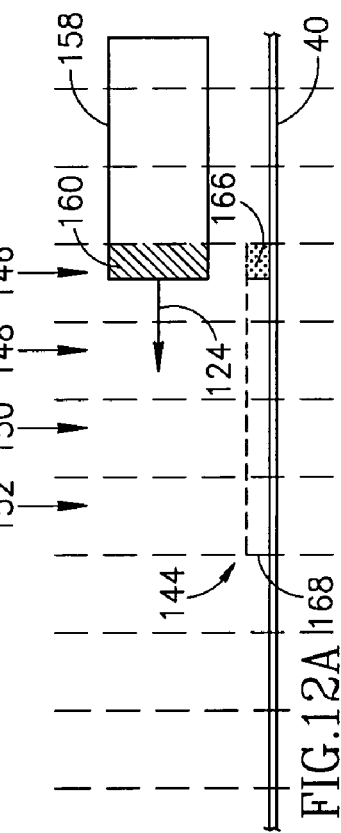
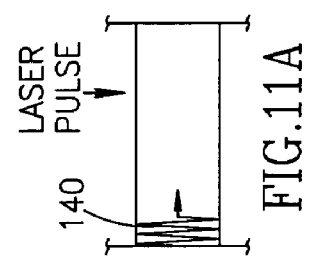
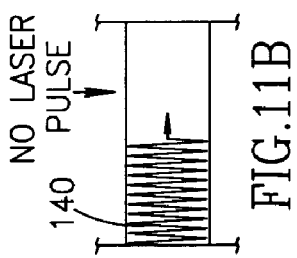
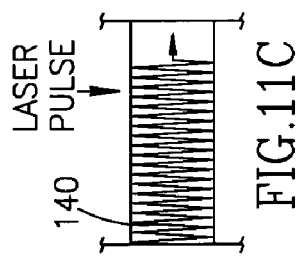

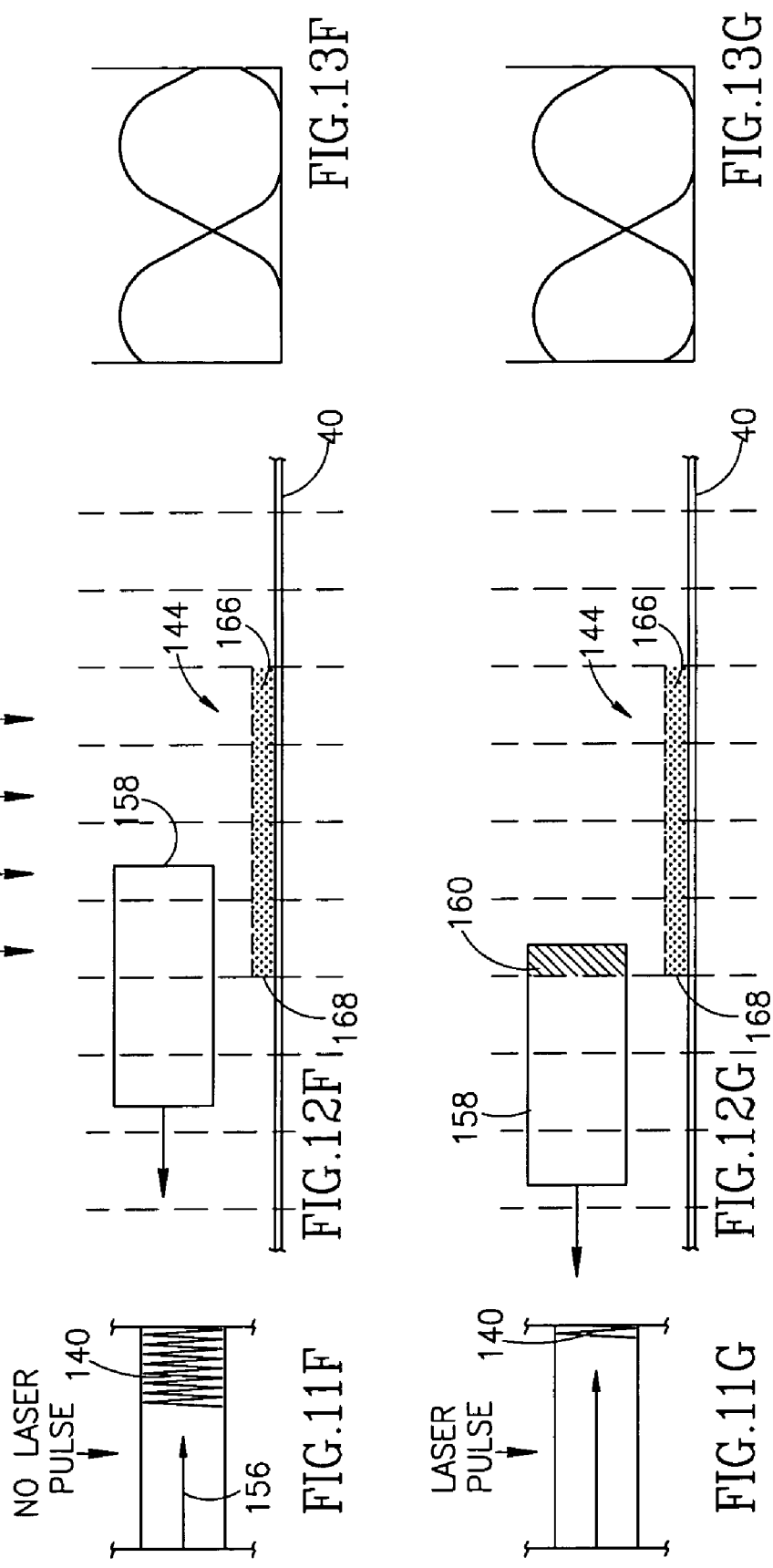

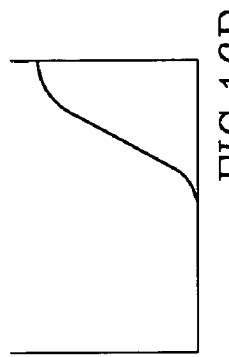
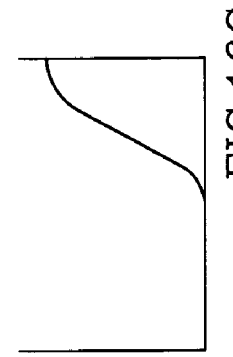
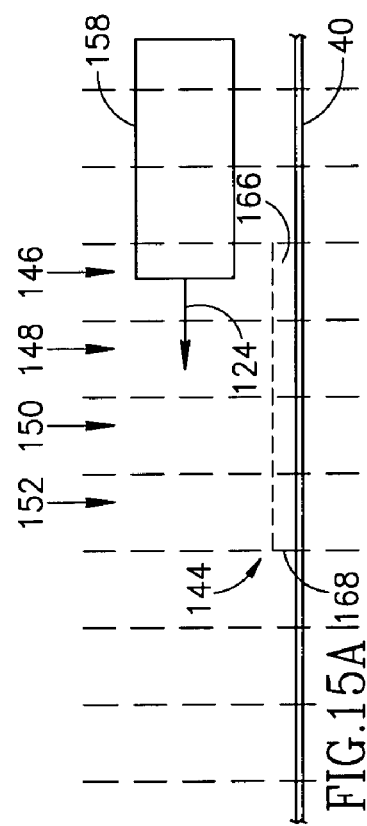
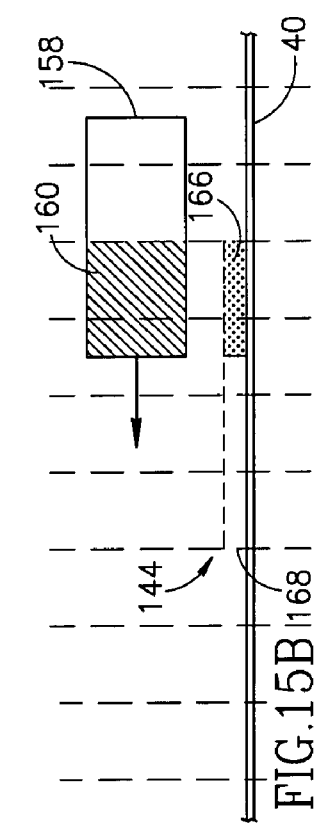
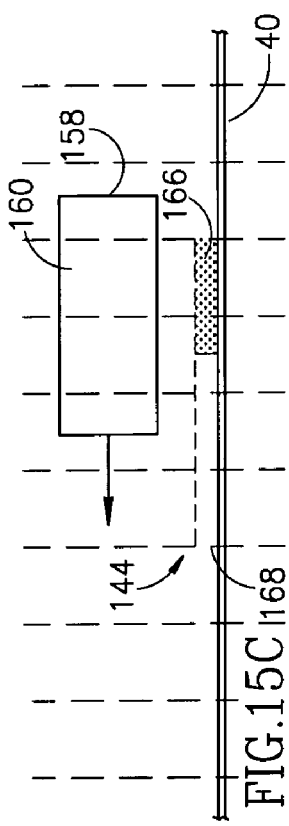
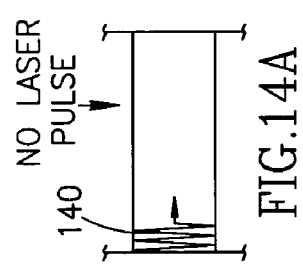
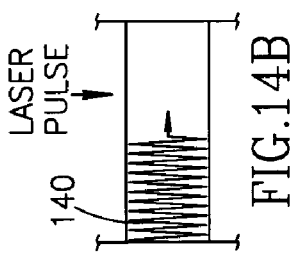
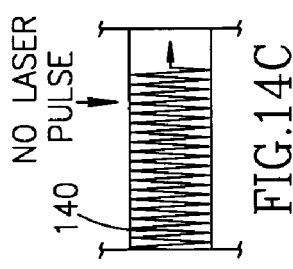

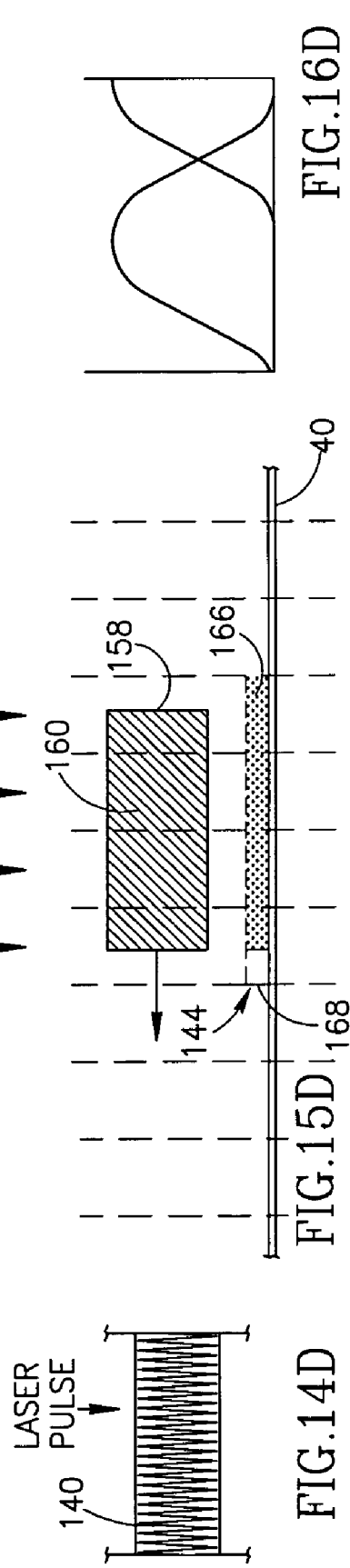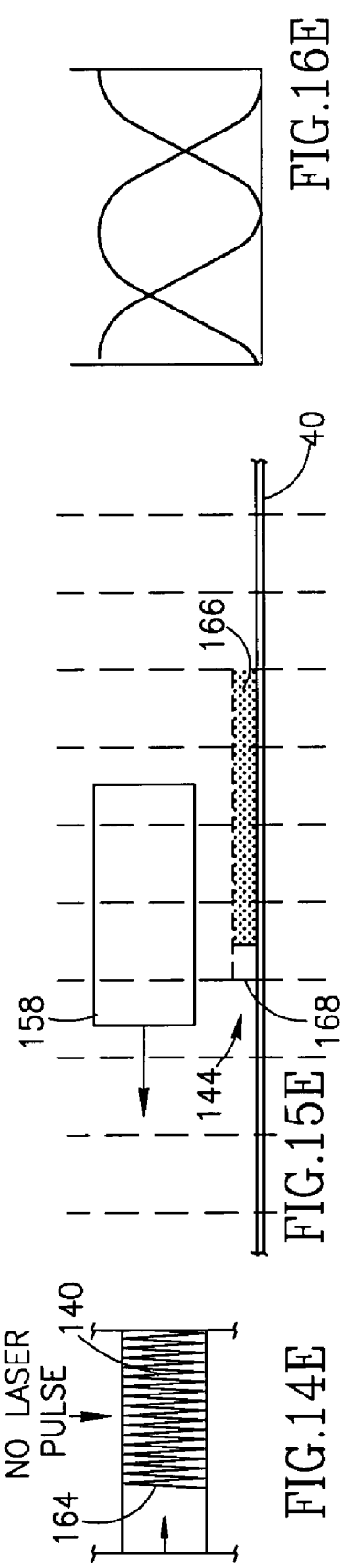

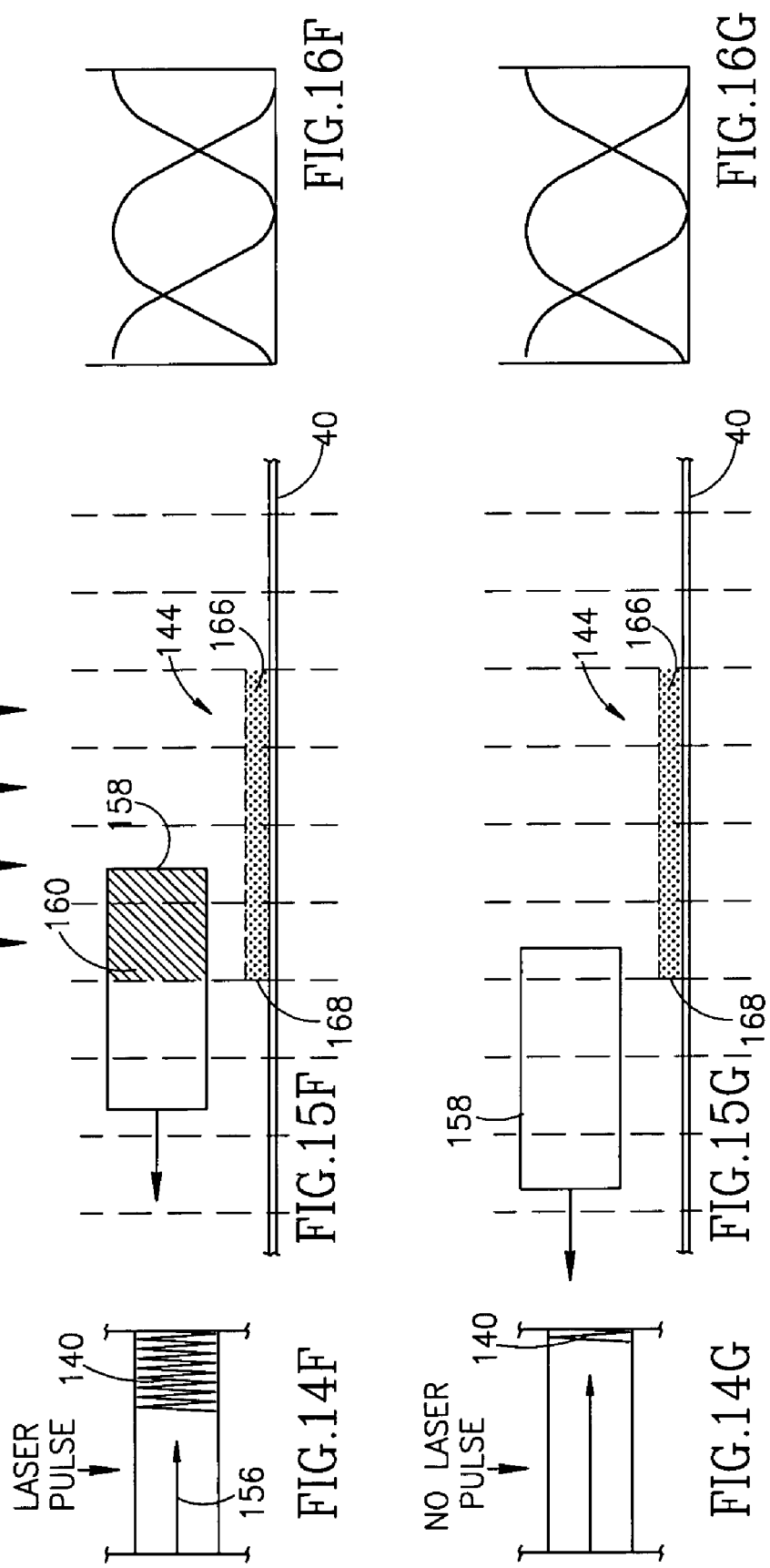

PULSE LIGHT PATTERN WRITER

FIELD OF THE INVENTION

The invention relates to devices for writing patterns using pulsed light beams in general, and of mode locked lasers in particular. An important application of the invention is in the production of printed circuit boards.

BACKGROUND OF THE INVENTION

In applications such as printed circuit board (PCB) production, a laser may be used to expose a pattern on a photoresist coating on a copper coated substrate. In a typical exposure system such as the DP 100 of LIS of Germany and available from Orbotech Ltd. of Yavne, Israel, a CW UV laser beam is scanned across the PCB surface, while its intensity is modulated in accordance with a raster pattern to be generated. The modulating device receives electronic pixel data supplied by control circuitry. In modern PCB production it is desirable to operate at high data rates to increase production speed. The practical data rate is limited by the modulation rate and/or the available laser power.

In the production of PCBs utilizing UV sensitive photoresists a CW Argon Ion laser is often used. Although they are widely utilized as UV light sources, Argon lasers, being gaseous lasers, have a number of drawbacks such as their being complicated and delicate to operate, poor maintainability and/or high price.

Various methods for producing UV laser radiation are known. For example, one such method utilizes an IR solid state laser oscillator to generate mode locked high repetition rate laser light pulses. The wavelength of the IR mode locked laser light is converted to UV by passing the mode locked IR light pulses through a non linear medium. However, the utilization of such lasers to expose photoresist at high data rates is severely limited by a paradox inherent in the frequency conversion process, which is extremely non-linear. Frequency conversion becomes more efficient as power increases.

Although mode locking is useful to obtain laser pulses each of which have a high peak power as is necessary to promote high efficiency frequency conversion, as the repetition rate of the laser pulses increases, for example in order to achieve increased data rates, peak power in individual pulses decreases and the resulting average UV power drops rapidly. Thus, for a given average IR power, the average peak power after frequency conversion drops as the repetition rate of the laser pulses increases, leading to reduced UV generation efficiency.

Practically, using pulsed lasers to write raster patterns is problematic for various reasons. Modulating data at a rate exactly equal to the pulse repetition rate of a mode locked laser is problematic due to difficulties in high speed pulse and data synchronization. Conversely, modulating data at a rate different than the pulse repetition rate of a mode locked laser is problematic due to timing errors in which a pulse is not available at exactly the time required to write or expose a pixel which is supposed to be written or exposed. This latter problem is particularly prevalent when data rates for writing pixels approach or exceed the pulse rate of an exposing radiation source—such as a mode locked laser.

U.S. Pat. No. 3,447,856 describes an optical pulse multiplier operative to split an incoming pulsed laser beam, to lengthen one of the optical paths with respect to the other and to recombine the optical paths.

GB patent application 2,245,790 A describes a structure comprising parallel plane mirrors operative to generate a plurality of mutually time delayed pulse trains from an incoming pulse train. The mutually time delayed pulse trains are subsequently recombined.

U.S. Pat. No. 5,462,433 describes a device for use in electronic warfare for delaying coherent RF signals with an adjustable time delay element. The RF signals are divided into multiple signal paths, some of the paths are delayed relative to the other paths, and then the delayed and non delayed paths are recombined to increase the pulse repetition rate.

U.S. Pat. No. 4,205,348 describes a laser scanner employing an acousto-optic modulator configured to take advantage of the so-called Scophony effect to simultaneously information modulate and deflect an incident CW laser beam so that the beam tracks a facet of a polygon scanner. The system reduces blurring in images on a recording surface.

An article entitled, "Pulsed Scophony Laser Projection System", J. B. Lowry et al., *Optics and Laser Technology* Vol. 20 No. 5 (October 1988), describes the use of a pulsed laser illumination to achieve a "freezing" effect instead of a scanning motion as is present in conventional Scophony modulators. In the absence of scanning motion in the image plane, the laser pulse repetition rate is both equal to and well synchronized with the data modulation rate.

WO 00/11766 and U.S. Pat. No. 6,037,967, the disclosures of which are incorporated herein by reference, describe direct scanner systems for printed circuits and semiconductor masks, respectively, in which a laser pulse rate that is equal to or higher than the data rate is utilized.

SUMMARY OF THE INVENTION

One broad aspect of some embodiments of the invention deals with the use of amplitude modulation of a high repetition rate pulsed light beam, such as a pulsed UV laser beam, to transfer information and in particular to expose a photosensitive surface. In some embodiments of the invention, the surface is exposed in a raster pattern and information modulation is asynchronous with the pulse repetition rate of the light pulses.

In some embodiments of the present invention, the pulse repetition rate of the light pulses is increased by a pulse repetition rate multiplier to a pulse repetition rate which is higher than the pulse rate of the light beam when emitted from its source. In some other embodiments of the present invention, an overall data rate which is higher than the pulse rate is obtained by providing a multiplicity of data channels, each of which operates at a data rate lower than the overall data rate, wherein each data channel independently modulates data directed to spatially distinct regions addressed by the light beam. The data channels may be associated with a multichannel modulator or with separate modulators.

Herein, a high pulse repetition rate light beam, such as is provided by a solid state laser diode pumped mode locked laser, is termed "quasi-CW". Asynchronously modulating pulsed radiation, such as by high pulse repetition rate mode locked laser radiation, is termed "quasi-CW modulation."

In embodiments of the present invention employing a quasi-CW modulating system, the pulse repetition rate may less than one laser pulse per increment of the modulation data rate.

In some embodiments of the invention the spatial location, on a recording medium, at which pulses begin to expose (or stop exposing) part of a raster pattern is at least partially spatially fixed, within the bounds of diffraction limitation during exposure by multiple laser pulses. Fixing the location may be accomplished, for example, by exposing pixels in a raster pattern with multiple partially overlapping pulses of variable spatial size wherein the spatial extent of the pulse is related to the location of the region being exposed in the raster pattern. In particular, the maximum extent of the laser pulse, is fixed (within the bounds of diffraction limitation such that it does not extend past a boundary of an area to be written.

An exemplary method of achieving this effect is to have the pulse incident on an acoustic wave modulator in which an acoustic wave having a leading edge and trailing edge is propagating. The travel time of the acoustic wave is generally sufficiently long so that, when the modulator is impinged upon by at least some light pulses, the leading edge or the trailing edge is at a different location in the modulator. In some embodiments the location of the leading edge or trailing edge of the acoustic wave is held in a fixed spatial relationship with respect to an edge on the recording medium, in a run of pixels to be exposed thereon while an image of the modulator is scanned across the recording medium. Edge fixing can be accomplished by coordinating the velocity of the acoustic wave in the modulator and the velocity of scanning.

In a broad aspect of some embodiments of the invention, a pulse repetition rate below the pixel rate is used in exposing a photosensitive surface of a recording medium such as a photoresist. In such systems, a pixel may sometimes be exposed by a single pulse of energy and it may sometimes not be exposed at all. In some embodiments an average of more than 0.75 pulses expose each pixel. Of course, this can mean that while most pixels are exposed by a single pulse, some are not. Alternatively, the pulses may expose a region which is wider than a single pixel and the regions exposed by time adjacent pulses partially mutually spatially overlap.

In a broad aspect of some embodiments of the invention, a pulsed light source is used to expose a first region on a photosensitive recording medium having a first size and comprising a plurality of pixels. Each pulse exposes an area that is smaller in size than the size of the first region but wider than a single pixel, and the first region is exposed, pulse by pulse, by multiple partially overlapping pulses from the pulsed light source. Optionally, the spatial size of the area exposed by each pulse varies in relation to its location in a pattern to be exposed. Additionally, at least one edge in the area exposed by at least some pulses is optionally fixed relative to an edge in the first region.

In some embodiments of the invention, an initial pulsed laser beam is wavelength converted to a second laser beam. Optionally, the initial laser beam is an IR beam and the second beam is a UV beam, and wavelength conversion is accomplished external to the laser cavity, for example by a non-linear medium. This embodiment allows for efficient generation of a UV beam having a power high enough for exposing a photoresist coated PC board and a pulse repetition rate high enough for quasi-CW modulation.

A broad aspect of some embodiments of the invention is concerned with the provision of pulsed light systems that are practical for direct writing on photoresists in the production of PCBs. According to some embodiments of the invention, the system comprises a pulsed UV laser light source and a pulse rate multiplication device which multiplies the pulse repetition rate of the UV laser light. In one aspect, some embodiments of the present invention allow for data rates higher than the laser's pulse repetition rate prior to the multiplication. Additionally and alternatively, portions of the UV laser light are independently and spatially modulated at a data rate that is suitable to be quasi-CW modulated, and the data rate used to modulate each portion is lower than the overall data rate.

In some embodiments of the invention, a laser writing system, for example, for directly imaging PCBs, is provided. This system optionally utilizes a high power solid state pulsed laser at a relatively long wavelength and low repetition rate, for example an IR mode locked laser oscillator operating at about 80 MHz and optionally having an average power of at least 1 W. The system transforms this laser light to UV, for example using a non linear optical medium. The medium may be located external to the laser cavity. The pulsed UV light is amplitude modulated and used to scan and expose a PCB coated with a UV sensitive resist to form a pattern.

In some embodiments of the invention, the UV light comprises a quasi-CW train of pulses as described above, such that methods known in the art may be used to modulate the UV light and utilize it to scan the area to be exposed.

There is thus provided, in accordance with an embodiment of the invention, apparatus for transmitting information at a data rate, comprising:

a pulsed light source that produces pulsed light having a pulsed repetition rate; and a modulator that asynchronously modulates the pulsed light at the data rate, wherein the data rate is higher than pulse repetition rate.

In some embodiments of the invention, the pulsed light source is a line source and wherein the modulator spatially modulates the line. In some embodiments of the invention, the modulator independently modulates different sections of the line at the data rate.

In some embodiments of the invention, the pulsed light comprises a laser beam.

There is further provided, in accordance with an embodiment of the invention, apparatus for recording an image on a photosensitive surface, comprising:

a pulsed light source that produces pulsed light having a pulsed repetition rate;

a modulator that modulates the pulsed light at a data rate; and a scanner that scans the modulated pulsed light over the surface, wherein the data rate is higher than the pulse repetition rate.

In some embodiments of the invention, the pulsed light source is a line source and wherein the modulator spatially modulates the line. Optionally, the modulator independently modulates different sections of the line at the data rate.

In some embodiments of the invention, the modulation is asynchronous with the pulses.

In some embodiments of the invention, the modulator selectably modulates portions of the beam, wherein said portions are delivered pulse by pulse to spatially overlapping regions of a photosensitive surface to build up a pixelized pattern.

In some embodiments of the invention, the modulated light scans over the surface in a first direction and wherein the surface moves in a direction perpendicular to the direction of scanning such that the surface is illuminated by a raster scan.

In some embodiments of the invention, the photosensitive surface is a photoresist.

In some embodiments of the invention, the pulsed light comprises a laser beam.

In some embodiments of the invention, the pulsed light is produced utilizing a pulsed light generator comprising:

a beam generator that produces an initial pulsed light beam having an initial pulse repetition rate; and a pulse repetition rate multiplier, which receives the initial pulsed light beam and produces at least one pulsed light beam having a higher pulse repetition rate than the initial rate. Optionally, the apparatus includes, a second repetition rate multiplier that receives an output beam from the repetition rate multiplier and produces an output beam having a repetition rate higher than the repetition rate of the beam that it receives. Optionally, the first repetition rate multiplier and the second multiplication rate multiplier each double the repetition rate.

Optionally, the increased pulse repetition rate is twice, three, four or greater than four times the initial pulse rate.

In some embodiments of the invention the pulsed light beam generator generates a laser beam. Optionally, the laser beam generator comprises:

a pulsed laser operating at an initial laser frequency;

a laser frequency converter that increases the laser frequency to produce the light beam.

Optionally, the pulsed laser comprises a mode locked laser.

Optionally, the pulsed laser is an infrared laser.

Optionally, the light beam is a UV laser beam.

In some embodiments of the invention, the power contained in the higher repetition rate pulses is substantially equal to the power of the initial pulsed light beam.

There is further provided, in accordance with an embodiment of the invention, a method for transmitting information at a data rate comprising:

providing pulsed light that is pulsed at a pulse repetition rate; and asynchronously modulating the pulsed light at the data rate, wherein the data rate is lower then the pulse repetition rate.

Optionally, the pulsed light source is a line source and wherein modulating comprises spatially modulating the line. Optionally, different sections of the line are independently modulated at the data rate.

There is further provided, in accordance with an embodiment of the invention, a method for recording an image on a photosensitive surface, comprising:

providing pulsed light that is pulsed at a repetition rate;

modulating the pulsed light at a data rate; and scanning the modulated pulsed light over the surface, wherein the data rate is higher than pulse repetition rate.

Optionally, the pulsed light source is a line source and wherein modulating comprises spatially modulating the line. Optionally, different sections of the line are independently modulated at the data rate.

In some embodiments of the invention, the modulation is asynchronous with the pulses.

Optionally, the modulated light scans over the surface in a first direction and wherein the surface moves in a direction perpendicular to the direction of scanning such that the surface is illuminated by a raster scan.

In some embodiments of the invention, the photosensitive surface is a photoresist.

In some embodiments of the invention, the pulsed light comprises a laser beam.

In some embodiments of the invention, providing the pulsed light comprises:

generating an initial pulsed light beam having an initial pulse repetition rate; and multiplying the initial pulse to produce at least one pulsed light beam having a higher pulse repetition rate than the initial rate.

In some embodiments of the invention, the method includes multiplying the at least one pulsed light beam to produce an output beam having a repetition rate higher than the repetition rate of the at least one pulsed light beam. Optionally, multiplying and further multiplying each double the repetition rate.

Optionally, the increased pulse repetition rate is twice, three times, four times or more than four times the initial pulse rate.

In some embodiments of the invention, the pulsed light beam is a laser beam.

Optionally, providing the pulsed laser beam comprises:

providing a pulsed laser that produces initial laser pulses at an initial laser frequency;

converting the laser frequency to a higher frequency to produce the light beam.

Optionally, the pulsed laser comprises a mode locked laser. Optionally, the initial pulses are in the infra-red. Optionally, the light beam is a UV laser beam.

In some embodiments of the invention, the power contained in the higher repetition rate pulses is substantially equal to the power of the initial pulsed light beam.

There is further provided, in accordance with an embodiment of the invention, apparatus for exposing a pattern on a photosensitive surface comprising:

a laser light source providing a beam formed of successive substantially instantaneous laser pulses separated by a time interval;

a data signal source that provides data signals;

a modulator that receives the beam and the data signals and selectively modulates the beam with a modulating signal responsive to the data signals for a time period longer than said time interval, such that the modulating signal is operative to modulate at least two successive pulses; and an optical subsystem that receives the modulated beam and projects an image of the modulator onto a photosensitive surface to expose a pattern thereon according to said modulating signal, wherein the modulating signal is an acoustic wave and wherein an attribute of the modulating signal changes between at least some of the two successive pulses.

In an embodiment of the invention, the modulator is an acousto-optical modulator.

In some embodiments of the invention, the modulator has a defined length, and the attribute is the length of the acoustic wave in the modulator.

In some embodiments of the invention, the shape of a spot formed by a pulse in the beam, as projected by the optical subsystem, is at least partly defined by the length of the acoustic wave in the modulator.

In some embodiments of the invention, the apparatus includes a scanning subsystem for scanning the image of the modulator along the photosensitive surface.

In some embodiments of the invention, the acoustic wave propagates in the modulator at a first velocity having a first rate of propagation and a first direction, and the image of the modulator is scanned across the photosensitive surface at a velocity that is related to the velocity of propagation of the acoustic wave, but in the opposite direction.

There is further provided in accordance with an embodiment of the invention, apparatus for exposing a pattern on a photosensitive surface comprising:

a laser light source providing a beam formed of successive laser pulses; and a modulator selectably modulating the beam to provide a multiplicity of pulses available to write a pattern, wherein at least some of the pulses available to write a pattern have different spatial shapes; and a scanner to scan the multiplicity of pulses available to write a pattern onto a photosensitive surface to form a pattern thereon.

Optionally, the laser light source is a mode-locked laser.

Optionally, the modulator is an acousto-optical modulator.

In some embodiments of the invention, the spatial shape of a pulse is defined by an acoustic wave in the modulator. In some embodiments, each pulse available to write a pattern exposes a spatially defined region on the photosensitive surface. Optionally, at least some spatially defined regions mutually overlap each other.

There is further provided in accordance with an embodiment of the invention apparatus for recording an image on a photosensitive surface comprising:

a pulsed light source that produces pulsed light having a first wavelength and a pulsed repetition rate;

a wavelength converter external to the pulsed light source that receives said pulsed light and outputs wavelength converted pulsed light having second wavelength which is less than the first wavelength;

a modulator that receives the wavelength converted pulsed light and modulates it at a data rate; and a scanner that scans the modulated wavelength converted pulsed light over the surface.

In some embodiments of the invention the pulsed light source is a laser.

Optionally, the pulsed light has a first wavelength in the IR spectrum.

In some embodiments of the invention, the wavelength converter is a non-linear medium.

In some embodiments of the invention the pulsed light source comprises a laser cavity and the non-linear medium is external to the laser cavity.

In some embodiments of the invention the wavelength converted pulsed light has a wavelength which is in the UV spectrum.

Optionally the non-linear medium is an LBO crystal.

In some embodiments of the invention the pulse repetition rate is less than the data rate.

Optionally the pulse repetition rate is multiplied by a pulse repetition rate multiplier.

BRIEF DESCRIPTION OF FIGURES

Exemplary embodiments of the invention are described in the following description, read in with reference to the figures attached hereto. In the figures, identical and similar structures, elements or parts thereof that appear in more than one figure are generally labeled with the same or similar references in the figures in which they appear. Dimensions of components and features shown in the figures are chosen primarily for convenience and clarity of presentation and are not necessarily to scale. The attached figures are:

FIG. 5 shows an alternative beam recombining component in accordance with an embodiment of the present invention;

FIG. 6 shows a system for writing a raster pattern on the surface of a substrate by simultaneously independently data modulating separate portions of an input laser beam;

FIG. 7 is graph of the energy profile of a laser beam pulse along an axis of scanning;

FIG. 8A-8G are simplified pictorial illustrations of an acoustic wave at consecutive stages of generation in an acousto-optical modulator crystal and provision of laser pulses at a first pulse rate;

FIG. 9A-9G are simplified pictorial illustrations showing various stages, corresponding to stages shown in FIGS. 8A–8G, of exposure of a run of pixels on a substrate to be exposed at a first pulse rate;

FIG. 10A-10G are energy graphs showing accumulated laser energy along a run of pixels at each of the stages of exposure shown in FIGS. 9A–9G;

FIG. 11A-11G are simplified pictorial illustrations of an acoustic wave at consecutive stages of generation in an acousto-optical modulator crystal and provision of laser pulses at a second pulse rate;

FIG. 12A-12G are simplified pictorial illustrations showing various stages, corresponding to stages shown in FIG. 11A-11G of exposure of a run of pixels on a substrate to be exposed at the second pulse rate;

FIG. 13A-13G are energy graphs showing accumulated laser energy along a run of pixels at each of the stages of exposure shown in FIG. 12A-12G;

FIG. 14A-14G are simplified pictorial illustrations of an acoustic wave at consecutive stages of generation in an acousto-optical modulator crystal and provision of laser pulses at a second pulse rate different from that shown in FIG. 11A-11G;

FIG. 15A-15G are simplified pictorial illustrations showing various stages, corresponding to stages shown in FIG. 14A-14G of exposure of a run of pixels on a substrate to be exposed at the second pulse rate;

FIG. 16A-16G are energy graphs showing accumulated laser energy along a run of pixels at each of the stages of exposure shown in FIGS. 15A–15G.

DETAILED DESCRIPTION OF EXEMPLARY EMBODIMENTS

Figure 1:
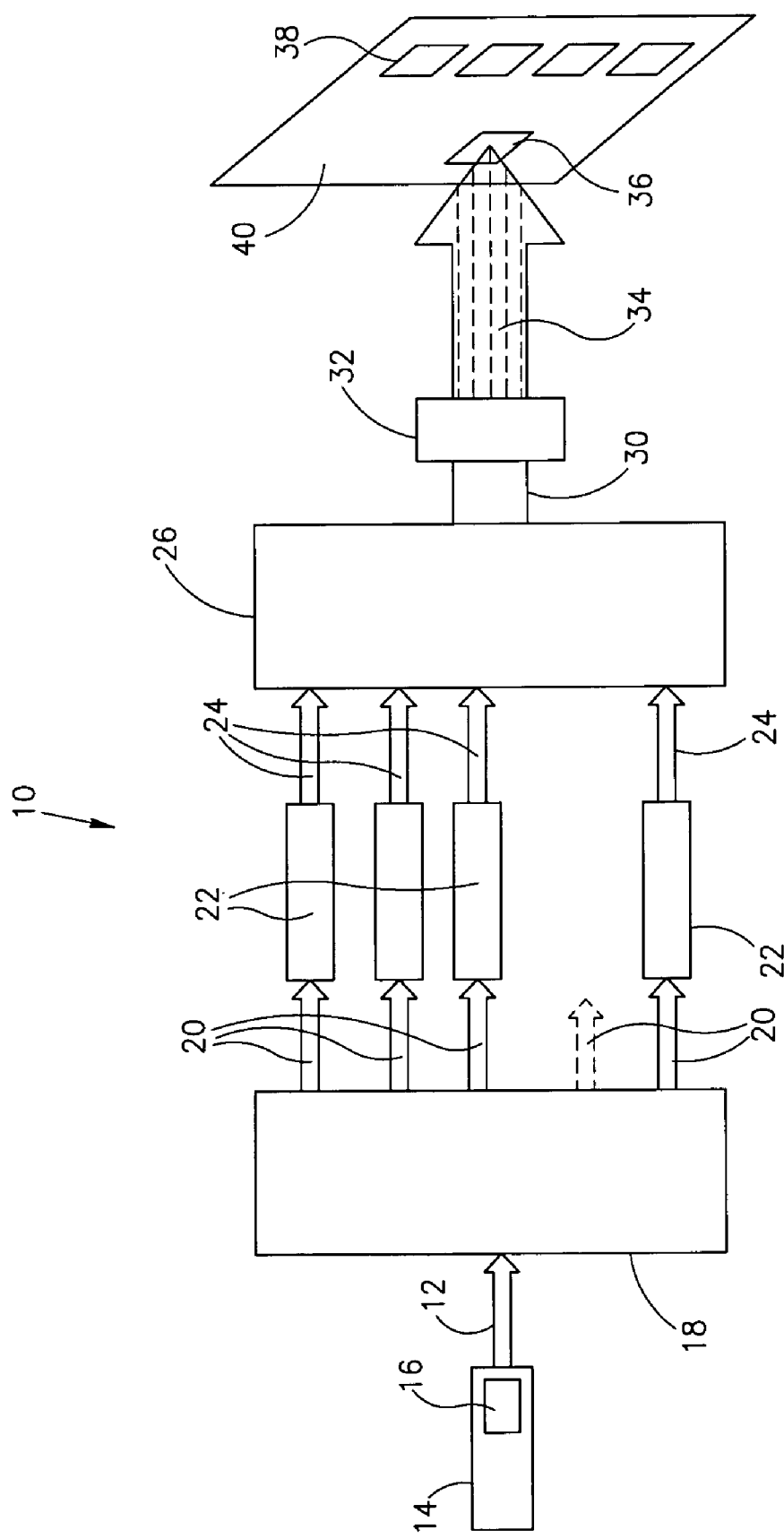
FIG. 1 is a schematic diagram showing the basic operational principle of certain embodiments of the present invention.

A way of overcoming the disadvantages of using an Argon Ion laser for exposing UV sensitive photoresists on PCBs, as described in the background section, is to start with an IR or other relatively long wavelength laser, for example, a solid state laser providing a mode locked IR output, and then to double or otherwise to convert its optical frequency (or wavelength) until UV radiation is obtained. This increase in optical frequency is achieved by doubling the optical frequency of the light at least once.

Solid state IR lasers are relatively efficient and reliable, a situation that facilitates the obtaining of mode-locked UV laser radiation at sufficiently high power through pumping and optical frequency conversion.

Because optical frequency conversion is a nonlinear process whose efficiency increases with increasing initial laser power, UV laser radiation is obtained by harmonic generation, for example using a non-linear crystal placed in the path of a laser beam produced by a high power IR or red laser such as the Tsunami mode-locked Ti:saphire laser from Spectra-Physics Lasers, pumped by a laser such as the Millenia laser of Spectra-Physics. While the pulse repetition rate of the Tsunami laser may, at best, be in the same range as data rates useful in high speed writing for PCB production, the above referenced problems of pulse/data synchronization make its use problematic. Moreover, the native repetition rate of pulses generated by mode locked lasers sets a limit on possible data rates using conventional methods of information modulation whereby information is modulated synchronously with the pulse repetition rate.

Thus, in accordance with some embodiments of the invention, the pulse repetition rate is further increased from the native pulse repetition rate generated by the mode locked laser by using systems built in accordance with embodiments of the present invention. Optionally, the pulse rate multiplication systems operate externally to the laser housing, after wavelength of the laser beam has been converted. Thus in accordance with some embodiments, wavelength conversion is performed while laser pulses are still at a relative low pulse repetition rate and high peak power per individual pulse as compared to the pulse rate and peak power after pulse rate multiplication is performed. In accordance with exemplary embodiments of the invention, the pulse repetition rate thus achieved after pulse rate multiplication is high enough to allow for quasi-CW modulation of the thus generated pulsed laser beam relative to a high data rate stream of information.

Thus, for example, in applications employing a pulse rate multiplier, multiplication of the pulse repetition rate is achieved by a device external to, and preferably downstream of, the high power UV laser which does not interfere with the laser's operational conditions so as to enable the laser to generate UV laser light at relatively high efficiency.

In accordance with some other embodiments of the present invention, a single input laser beam is provided and spatial portions of the beam are each simultaneously and independently information modulated by a data channel in an array of data channels. Each channel has a reduced data rate suitable to quasi-CW modulation of a spatial portion of the input laser beam, while an overall data increased rate for the entire beam is obtained.

Reference is now made to FIG. 1 which schematically depicts the basic operational principles of an exemplary UV laser exposure system 10, employing a pulsed laser source and a pulse repetition rate multiplier, used in direct writing on a photoresist and built in accordance with some embodiments of the present invention. A pulsed UV laser beam 12, obtained from a high power pulsed laser 14 passed through a wavelength converter 16, such as a non-linear crystal inside or external to the laser cavity, and having a pulse repetition rate $f_0$, enters a beam splitting device 18, which splits the initial pulsed beam into N beams 20. The N split beams are then each delayed by delay optical circuits 22, to produce N time delayed pulsed beams 24 which are subsequently combined by beam combiner 26 to form a combined beam 30.

Combined beam 30 is passed through a modulator 32, operative to data modulate the beam 30, or portions 34 of the beam as described hereinbelow in greater detail with respect to FIG. 5. Combined beam 30 is further directed to a single target 36, or a plurality of targets 38 to expose a pattern on photoresist on a substrate 40, such as a PCB. It is appreciated that alternatively each of N time delayed beams 24 may be information modulated by a plurality of modulators (not shown) and mutually directed to expose targets 36 and 38 on substrate 40 without recombination of each of the N time delayed beams 24.

When a time delay $T_n$, equal to $n\Delta t$ is imposed on each of N beams 20 (where n is a numbering index of the beams, from 0 to N−1) by their respective delay optical circuits 22, a series of time delayed pulsed beams 24, the pulses of which are shifted in time by $\Delta t$, is obtained. The time delayed pulsed beams 24 are also separated in space when the optical set up shown in FIG. 1 is used. The pulse repetition rate of a beam in a series of time delayed pulsed beams 24 is the same as the pulse repetition rate of beam 12, however the temporal offset of pulses among time delayed pulsed beams is a function of delay $T_n$ and the number of delay lines N.

The only general condition that these delayed beams have to satisfy is $$N*\Delta t \leq 1/f_0 \qquad \text{Eq.(1):}$$

where N is the number of beams 20 and $f_0$ is pulse repetition rate of laser 14. At the end of an Nth pulse (a delay of $(N-1)*\Delta t$) in a time delayed pulsed beam 24, a subsequent pulse in beam 12 enters beam splitting device 18 and the splitting and delaying process repeats itself. In case $N\Delta t=1/f_0$, the Nth pulse of a pulse in time delayed pulsed beams 24 will occur $\Delta t$ prior to the first pulse associated with a subsequent pulse in beam 12. Delay $T_n$, may be varied or kept constant over the period $t_0=1/f_0$, as long as the condition of equation (1) is satisfied. In general, it is not necessary that the time between the Nth pulse of one series of pulses and the first pulse of the next series of pulses be exactly equal to $\Delta t$. Furthermore, it is not necessary that the time between pulses be exactly the same, nor is it necessary that the pulses have precisely the same energy at least for writing on PCBs. Time delayed pulsed beams 24 enter the beam combining device 26, wherein the individual time delayed pulsed beams 24 are combined according to a predetermined scheme.

Ideally, all the N pulses should be of substantially the same energy and equally spaced. This situation is generally preferable, although not required, since this results in a minimum fluctuation of laser power. In some embodiments of the present invention, variations in energy are compensated by scanning beam 30 to expose a pattern including a plurality of targets 38, wherein separate portions 34 of combined beam 30 each expose a line of targets. Each target in the plurality of targets 38 is exposed at least twice by partially overlapping combined beam 30 in successive scans in accordance with methods shown and described in WO 00/02424, the disclosure of which is incorporated herein by reference.

The following section describes the details of steps of a) splitting an input beam 12 to produce N beams 20; b) delaying pulses in at least some of N beams 20 to produce time delayed pulsed beams 24; c) recombining the time delayed pulsed beams 24, and d) redirecting the combined beam 30, all in accordance with an embodiment of the present invention.

Figure 2:
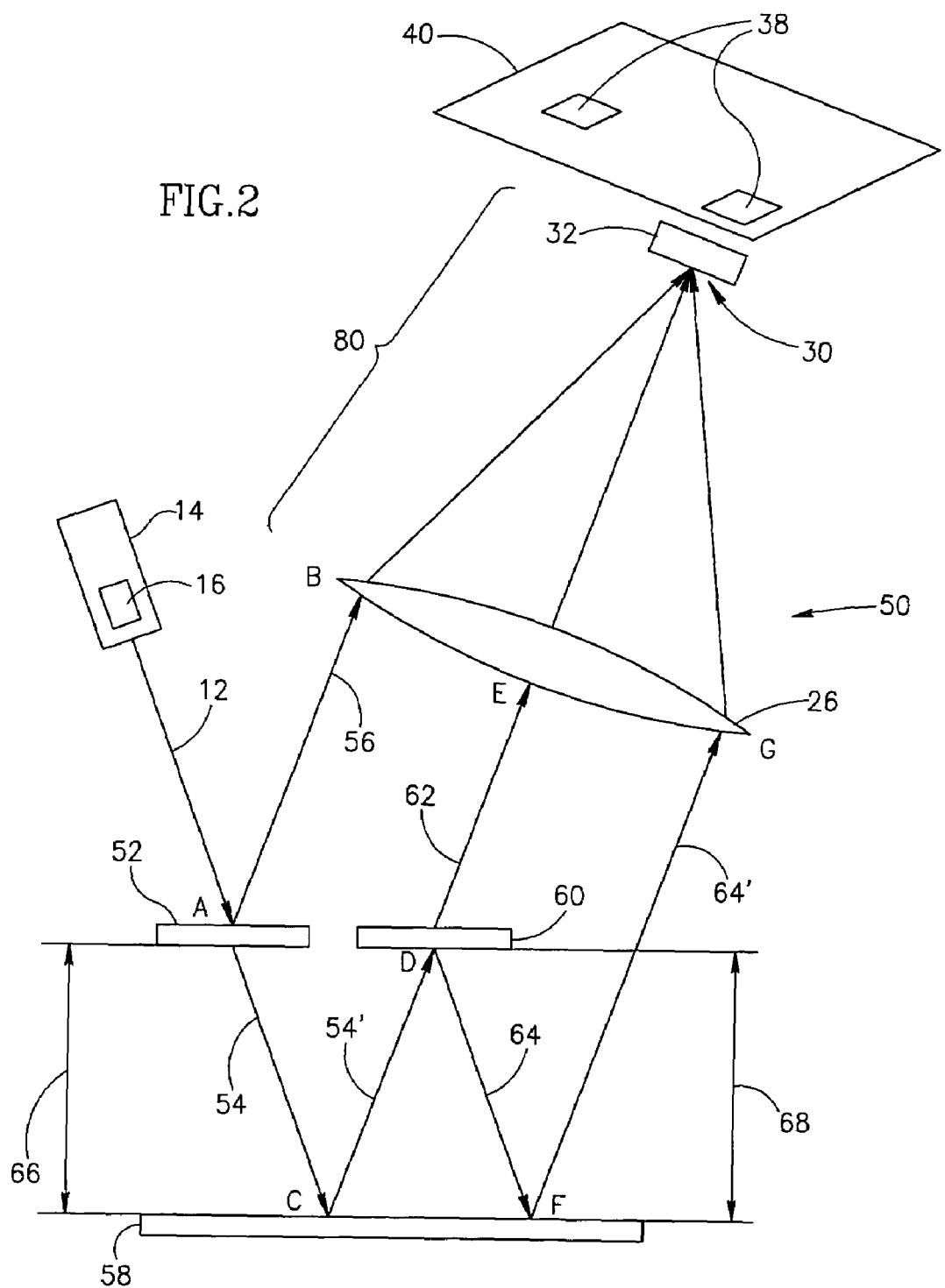
FIG. 2 is a schematic diagram showing a pulse repetition rate multiplication device in accordance with an embodiment of the present invention.

Reference is now made to FIG. 2, which shows a pulse repetition rate multiplication device 50 constructed and operative in accordance with an embodiment of the present invention. Repetition rate multiplication device 50 may include a beam splitting device 18, delay optical circuitry 22 and a beam combiner 26 shown in FIG. 1, and is employed externally to a laser 14, whose optical frequency is converted by a wavelength converter 16, for example by harmonic generation, as is known in the art.

A pulsed, optionally collimated, UV laser beam 12, is made to impinge on a first partially reflective front surface mirror 52. The initial pulsed beam 12 is split into two beams, one of which is transmitted (54) and the other of which is reflected (56). Transmitted beam 54 is reflected by a 100% reflective mirror 58. The resulting post reflection transmitted beam (54') is directed towards a second partially reflective front surface mirror 60. Post reflection transmitted beam 54' is split by mirror 60 into a second transmitted beam (62) and a second reflected beam (64) directed to mirror 58. Reflected beam 64 is reflected again by mirror 58 to form beam 64'. Beams 54 and 64 may be made to impinge on a single mirror 58 as shown in FIG. 2 or, alternatively, on two separate mirrors (not shown in FIG. 2 for the sake of clarity).

In order to obtain from an initial pulsed laser beam 12 three beams 56, 62 and 64', together forming time delayed pulsed beams 24 in FIG. 1, generally having pulses of equal peak power, in the arrangement shown in FIG. 2 the reflectivity and transmission of partially reflective mirrors 52 and 60 should ideally be as follows: partially reflective mirror 52—reflectivity 33.33% and transmission 66.67%; partially reflective mirror 60—both reflectivity and transmission 50%. In this way beams 56, 62 and 64' will all have power $P_f = P_i/3$ where $P_f$ is the final power of each beam and $P_i$ is the initial power of beam 12. The power in each of split beams 56, 62 and 64' is thus controlled by the reflectivity of partially reflective mirrors 52 and 60. This division is based on lossless mirrors. If there is some loss on the mirrors, the reflectivities are ideally adjusted accordingly.

The embodiment shown in FIG. 2 may be extended to produce any desirable number N of time delayed pulsed beams of equal power by employing a series of lossless partially reflecting mirrors such as 52 and 60 having reflectivity values given by 1/N, 1/(N−1), . . . , 1/2, respectively.

In the embodiment shown in FIG. 2, lengths AB, ACDE and ACDFG control the time delays between beams 56, 62 and 64'. The lengths AB, ACDE and ACDFG are controlled by distances 66 and/or 68, and the angle between mirrors 52 and 58 on one hand and 58 and 60 on the other. In order to obtain three substantially equally spaced (in time) pulses out of each initial pulse in beam 12, the lengths should be substantially ACDFG−ACDE=ACDE−AB=$(t_0/3)$*c, where c is the speed of light in the appropriate medium. It is appreciated by persons skilled in the art that the distance will have to be modified in accordance with the thickness and refractive indices of mirrors 52 and 60.

Beams 56, 62 and 64', corresponding to time delayed pulsed beams 24 in FIG. 1, are, for example, combined by beam combining device 26 (a lens as shown is an exemplary embodiment) into a combined beam 30 impinging on modulator 32 which is operative to modulate information into beam 30. At the end of a cycle of "splitting-combining-redirecting" applied to a pulsed beam 12, a subsequent pulse in beam 12 reaches point A on mirror 52 and the whole beam "splitting-combining-redirecting" cycle repeats itself. Dividing each pulse in beam 12 into three pulses means that the initial pulse repetition rate of laser 14 is tripled by the action of pulse rate multiplication device 50.

In some embodiments of the present invention, mirrors 52, 58 and 60 and beam combining device 26, are integrated into a single optomechanical structure in order to obtain a stand alone pulse repetition rate multiplying apparatus. Such a stand alone unit has the possibility of being retrofitted to a pulsed laser 14 and to serve different lasers at different times. By operating externally to laser 14, pulse rate multiplication device 50 does not perturb the proper operation of the laser or its efficiency. Pulse repetition rate multiplier device 50, when used with mode-locked lasers, allows for the multiplication of the laser's original pulse repetition rate without changing its resonant cavity length or any other characteristics.

Figure 3:
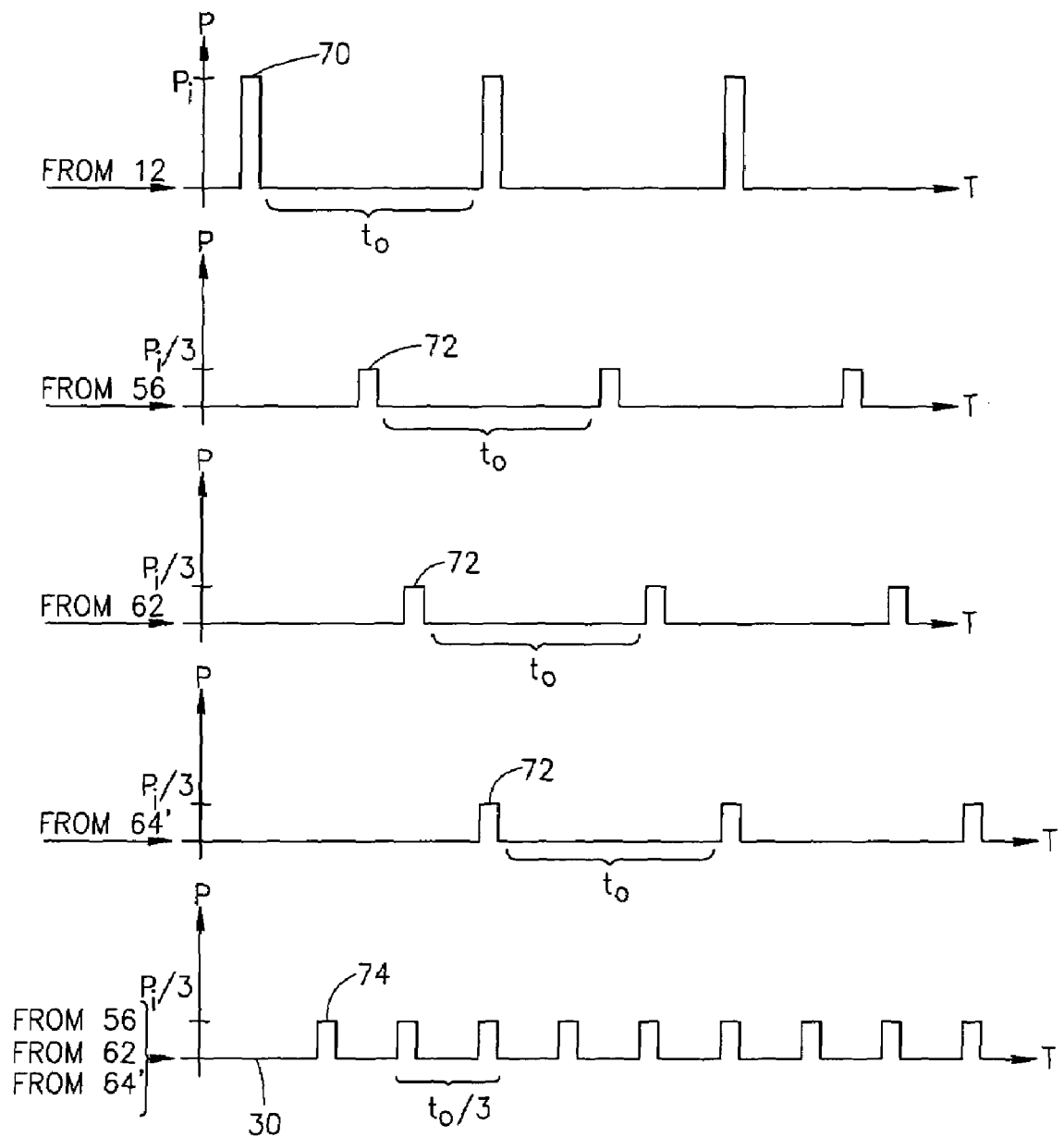
FIG. 3 shows a timing graph of input, intermediate and output beam pulses entering and exiting the pulse repetition rate multiplication device sketched in FIG. 2.

Reference is now made to FIG. 3 which is a timing graph showing the timing and peak power of pulses in beam 12 input into pulse repetition rate multiplication device 50, the timing and peak power of pulses in beams 56, 62 and 64', and the timing and peak power of pulses in combined beam 30 impinging on modulator 32 in accordance with the embodiment shown in FIG. 2. As seen in FIG. 3 beam 12 has pulses 70 each of which has a peak power $p_i$ and is offset in time by $t_0$. Each of beams 56, 62 and 64' has pulses 72 each of which has a peak power $p_i/3$ and is offset in time from other pulses 72 in the same beam by time $t_0$. Each pulse 72 in one of beams 56, 62 and 64' resulting from a pulse 70 in beam 12 is offset in time respective to a corresponding pulse 72 resulting from a pulse 70 in the other two of beams 56, 62 and 64' by time $t_0/3$ or $2t_0/3$ respectively. Upon combining beams 56, 62 and 64', combined beam 30 has pulses 74 each of which has a peak power $p_i/3$ and is mutually separated in time by time interval $t_0/3$. Thus, combined beam 30 has three times the pulse repetition rate and duty cycle of pulses in beam 12. Although the peak power of each pulse 74 is ⅓ the peak power of each pulse 70, the same average power is maintained.

Figure 4:
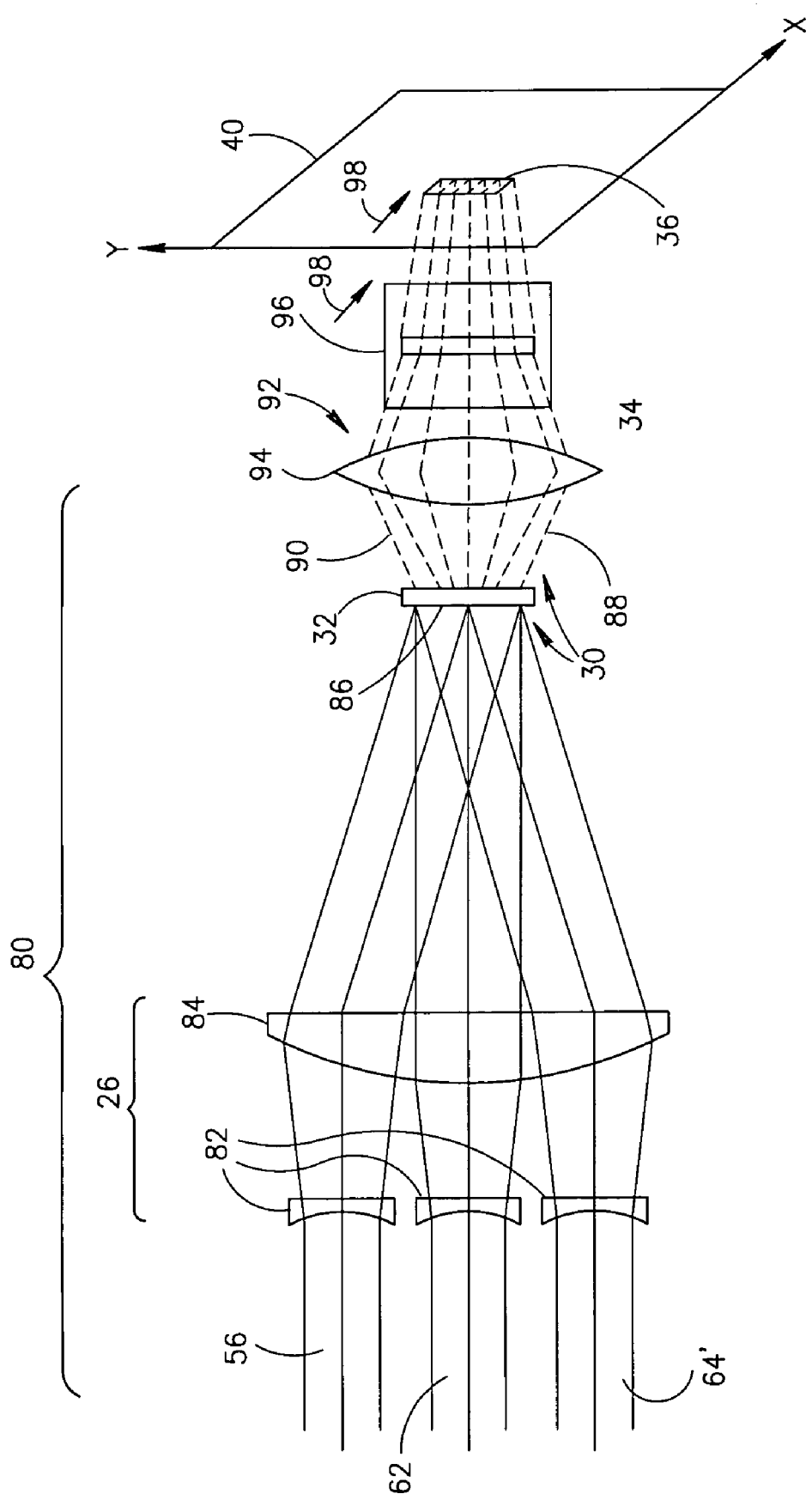
FIG. 4 shows an exemplary beam recombination setup in accordance with an embodiment of the present invention.
Figure 13D:
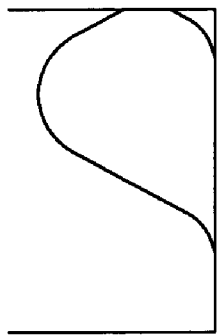
Figure 13E:
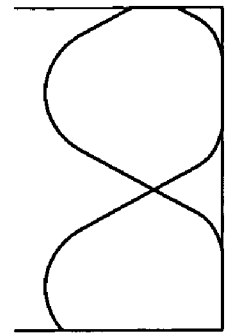
Figure 12D:
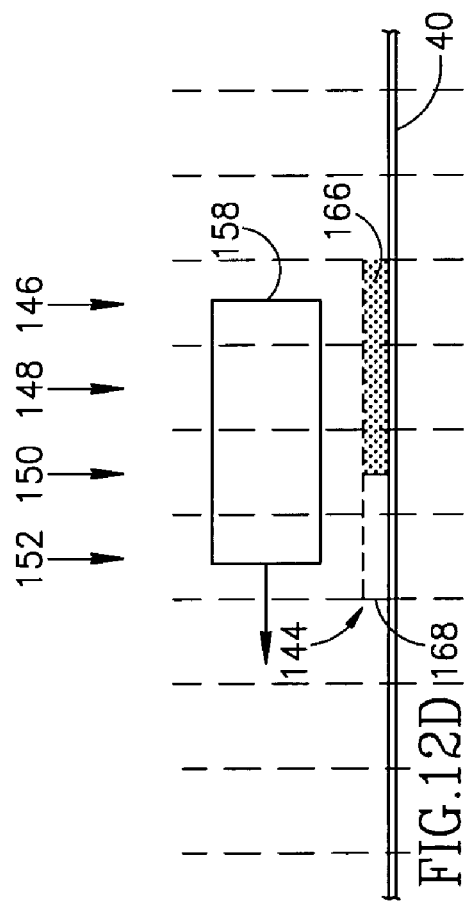
Figure 12E:
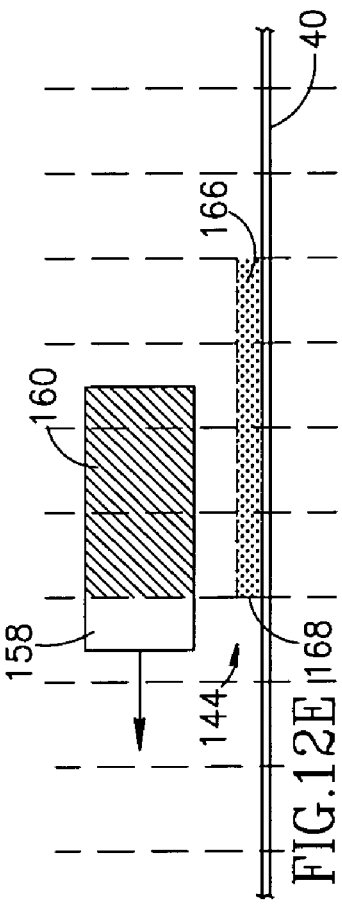
Figure 11D:
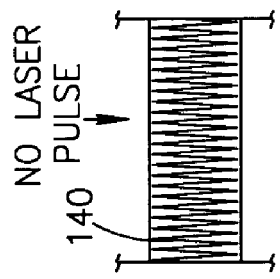
Figure 11E:
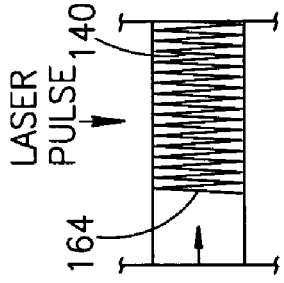

Reference is now made to FIG. 4 which shows details of beam combining and modulating region 80 of FIG. 2, in accordance with an embodiment of the invention. Each individual beam 56, 62 and 64' is imaged onto an active aperture portion (not shown) of a modulator 32, conjointly by a combination of spherical lenses 82 (negative lenses are shown, positive lenses may also be used) and cylindrical lens 84, to form combined beam 30 on the input surface 86 of modulator 32. It is appreciated by persons skilled in the art that the combined beam 30 may need to be further optically shaped to match the active aperture portion and other characteristics of modulator 32. For instance, an optional cylindrical lens (not shown), its optical axis oriented at 90° with respect to lens 84, may be interposed into the beam path to shape the beam 30 into to a desired slit-like shape at modulator 32. According to this imaging scheme, each individual beam 56, 62 and 64', together forming combined beam 30, preferably completely illuminates the active aperture portion of modulator 32, and modulator 32 modulates the combined beam 30 at a data rate in accordance with a pattern to be generated. After being modulated by modulator 32, the part of combined beam 30 inside of boundaries 88 and 90 are imaged by imaging optics 92, a single lens 94 being shown for simplicity of illustration, via a multi-faceted rotating polygon mirror 96 (only one face and its direction of motion 97 are shown), onto a target 36 on substrate 40. Polygon mirror 96 rotates to scan a line of targets 36 in the direction of scanning 98, for example along the X axis, while substrate 40, such as a photoresist clad PCB, moves in the generally orthogonal direction corresponding to the Y axis.

In accordance with some embodiments of the present invention, portions 34 of combined beam 30 are simultaneously independently modulated by modulator 32 to write multiple targets 38 (FIG. 1), each of which are mutually spatially offset.

It is appreciated by persons skilled in the art that the relative distances between modulator 32, lens 94 and polygon 96 in FIG. 4 are only schematic representations. In some embodiments according to this invention, lenses 82 and 84 are replaced by prism 99, shown in FIG. 5, which combines beams 56, 62 and 64' on modulator 32. Other methods of scanning a beam, as known in the art may also be used.

If, instead of lens 26 in FIG. 2, three individual lenses are positioned in split beams 56, 62 and 64', the beams could be aimed towards three different targets 38 simultaneously. Furthermore, each beam can be spread to form a line and modulation schemes, such as those known in the art, may be provided to modulate individual pixels in the lines formed by each of beams 56, 62 and 64'.

By varying distances 66 and 68 in FIG. 2, variable/different time delays may be imposed on beams 62 and 64'. By varying angle between mirrors 52 and 60 on the one hand and mirror 58 on the other hand, (see FIG. 2), the directions of beams 56, 62 and 64' may be controlled. Additionally, the diameter of input beam 12, may be optimized to fit the optics geometry. It should be understood that the angles shown are greatly exaggerated. In general the angle between the beams impinging on modulator 32 is very small.

Reference is now made to FIG. 6 which is a simplified pictorial illustration of a laser writing system 100 for writing a raster pattern on the surface of a substrate by simultaneously independently data modulating separate portions of an input laser beam 12, in accordance with some embodiments of the invention.

In accordance with some embodiments of the present invention a pulsed laser beam 12 is emitted by a laser 14, for example, a mode locked laser operative to generate a stream of laser pulses. Beam 12 is shaped by suitable optics (not shown) and is imaged onto the input surface 102 of an acousto-optic multi-channel modulator 104. Multi-channel modulator 104 optionally includes a plurality of laser beam modulating channels 106, formed, for example of a suitable material such as crystalline quartz, that transmits radiation of the laser wavelength. Each of channels 106 is independently controlled by one of data generators 108–116 to modulate data at a data rate.

Laser beam 12 passes through the modulator medium associated with each of channels 106, each of which independently modulates a spatially defined portion 118 of laser beam 12. An image of a central plane of each of channels 106 is projected by suitable optics (not shown) via a rotating polygon 120 and subsequently onto a substrate 40 at a plurality of targets 38 forming pixels in a raster pattern. As polygon 120 rotates, in the direction of arrow 122 images of the central planes of channels 106 are continuously scanned across substrate 40 in scan direction 124 while data is modulated at a data rate. Thus when an acoustic wave is present in a channel 106 the respective laser beam portion 118 is deflected so that the portion exposes one of targets 38 such as pixel 126 on substrate 40. When no acoustic wave is present in a channel 106, the respective portion 118 does not expose a target, for example pixel 128. The data rate is the rate at which the modulator is switched on and off, to generate or to stop generating, an acoustic wave, it being appreciated that the acoustic wave has a generally non-instantaneous rise time and travel time through the medium forming a channel 106 in modulator 104.

In some embodiments of the invention, modulator 32 may be, for example, a modulator employing operative principles described in U.S. Pat. No. 5,309,178 to Abraham Gross, and further described WO 00/02424, both of which are incorporated herein by reference. An exemplary arrangement of optics for projecting a laser beam onto a multichannel acousto-optic modulator and scanning the laser beam to generate a pattern on a PCB is also described in WO 00/02424.

Generally, portions 118 are at least partially mutually overlapping, and the total number of channels 106 generally corresponds to the number of pixel lines in a pattern to be simultaneously written on substrate 40. In accordance with some embodiments of the present invention, the size of the image of each channel when projected on substrate 40, in the direction of scanning 124, is for example, equivalent to three pixels.

It is noted that by modulating laser 12 with a multichannel modulator operative to simultaneously modulate various spatially defined portions 118, inasmuch as the data is divided over a spatial region a desired overall data rate may be obtained while simultaneously reducing the data rate provided to each channel 106. Thus, if modulator 32 has a total of N data modulation channels, and S is the total data rate required to write a raster pattern in a given time, each portion 118 of laser beam 12 is temporally modulated at a data rate which is S/N.

In some exemplary embodiments of the present invention modulator 32 includes at least 24 adjacent channels 106. Assuming that data is to be written at a data rate of between 300–1200 Mega pixels/second, then the modulation data written by each channel ranges between 12.5–50 Mega pixels/second. Assuming that laser 12 generates a stream of approximately 80 MHz pulses, then each pixel is written by an average of between 1.6–6.4 laser pulses as a function of the data rate in each channel.

Thus, the average number of pulses available to expose a pixel, may be increased by increasing the repetition rate of pulses, for example by interposing a pulse repetition rate multiplier such as device 50 (FIG. 2) between laser 14 and modulator 32. Alternatively, the effective data rate per channel may be reduced. Reduction of the data rate per channel may be achieved either by reducing the overall data rate S or by increasing the number of channels 106.

It is appreciated by persons skilled in the art that individually modulated portions of laser beam 12 may be spatially overlapping portions or discrete portions, each of which is independently modulated by a channel in modulator 32, or by a separate modulator.

As the number of pulses in laser 12 available to write a pixel in a data stream approaches or falls below one pulse per pixel, a pattern written by a quasi CW writing mode using conventional modulating methods becomes more susceptible to timing errors. Timing errors occur when a data bit representing a pixel to be written, for example as provided by one of data generators 108–116, is missed, in whole or in part, by a pulse in laser beam 12. When timing errors occur, a pixel in a target 36 that should be written is in actuality only partly written or not written at all.

It is appreciated by persons skilled in the art that in systems for writing a raster pattern, timing errors particularly manifest themselves along edges extending between regions which are to be exposed and regions which are not to be exposed. Unaccounted for timing errors typically result in an unevenness or drift in the location of an edge. In accordance with some embodiments of the invention, a pulsed laser beam writing system, such as system 100, for exposing a raster pattern on a substrate is configured so that, during successive pulses, the location of an edge of a portion of the laser beam exposing a run of pixels is substantially fixed to a desired location to be exposed on substrate 40. Edge fixing is accomplished for example, by coordinating the velocity of the acoustic wave in the modulator 32 and the velocity of scanning. Preferably the velocity of an image of the acoustic wave formed by imaging optics 94 on substrate 40 and the velocity of scanning an image of the modulating portion of modulator 32 are substantially equal in magnitude (preferably <±25%) but directed in mutually opposite directions. Accordingly, coordinating the relative directions and velocities of the projected image of the acoustic wave and the velocity of scanning effectively "freezes" the image of the acoustic wave in modulator 32 on the substrate 40 as shown and described in greater detail hereinbelow with reference to FIGS. 8A–16G.

As a result of edge fixing, the location of the image of the acoustic wave becomes substantially "motionless" on the substrate and the location of edges in a region exposed by successive pulses becomes insensitive to the exact timing of light flashes resulting from the laser pulses. Inasmuch as the spatial extent of a spot formed by laser light portions 118 is greater than a single pixel wide in the scanning direction, for example, being about 3 pixels wide in the scanning direction, an adequate number of exposure pulses is provided at every point addressed by the beam as it sweeps across substrate 40. Although the size of the spot is greater than a single pixel wide in the scanning direction, the positioning of feature edges is still preferably determined by the size of the addressing elements which is a function of data rate at which pixels are addressed in each modulator channel 106 and the velocity of scanning. Further decreasing the ratio of laser pulses to pixel rate is ultimately limited by pattern errors arising from unevenness of exposure due to the Gaussian energy profile of the laser beam in the scanning direction.

It is noted that the foregoing effect is similar to the well known Scophony scanning effect, conventionally used to minimize spatial blurring of a generated pattern caused by: a) the finite velocity of the acoustic wave in the modulator and b) the continuous nature of the laser illuminator. In accordance with some embodiments of the present invention the finite velocity of the acoustic wave in a modulator channel 106 enables an acoustic signal corresponding to a data pixel to be impinged upon by multiple light flashes formed by successive pulses. Multiple mutually partially overlapping images of laser pulses, spatially limited by an edge of the acoustic wave which is fixed in relation to an edge to be written on substrate 40, are thus projected onto substrate 40. It should be noted that while the Scophony effect has been applied in the past to CW illumination, the application to pulsed scanning is believed to be new. Such application is based on the realization that it is not necessary to have CW illumination to write a well defined edge, but that pulsed illumination and especially quasi-CW pulsed illumination can also form a sharp edge, in conjunction with the effect.

Reference is now made to FIG. 7, which is a graph of the energy profile of a laser beam pulse along an axis of scanning. In accordance with some embodiments of the present invention, the energy profile 130 of laser beam 12 in the direction of scanning 124 (FIG. 6) is a generally Gaussian profile. Relative to the time scale of propagation of an acoustic wave in an acousto-optic modulator channel 106, and to the time to scan a pixel on substrate 40, mode locked laser pulses are essentially instantaneous. Each pulse is separated by a time interval ranging between 3–50 nanoseconds, depending on the repetition rate of pulses in laser beam 12, and whether the repetition rate is multiplied using a pulse repetition rate multiplier as described hereinabove. The quantity of energy delivered to a target 38 in a pulse is a function of the segment of laser energy profile 130 that reaches target 38. The segment of the laser energy profile in a laser pulse is determined by modulation provided by modulator 104, for example by the presence and position of an acoustic wave in an acousto-optical modulator.

Reference is now made to FIGS. 8A–8G which are simplified pictorial illustrations of an acoustic wave 140 at consecutive stages of propagation thereof in a modulating region 142 of an acousto-optical modulator such as is associated with one of beam modulating channels 106 (FIG. 6); and to FIGS. 9A–9G which are simplified pictorial illustrations showing various stages, corresponding to stages shown in FIGS. 8A–8G, of exposure of a run of pixels 144, comprising pixels 146, 148, 150 and 152, on a substrate 40, such as a photoresist-clad PCB, to be exposed in accordance with an embodiment of the present invention. Shading in run 144 indicates exposure by a laser beam pulse. FIGS. 8A–9G are illustrative of an exemplary method that may be employed to minimize timing errors, which method is applicable even when the number of laser pulses available to expose a pixel in a quasi CW modulation configuration falls below an average of two pulses per pixel, and approaches or is less than one pulse per pixel or less. As seen in FIGS. 8A–9G, a sequence of about 7 consecutive pulses is employed to expose a linear region of four pixels, corresponding to an average of about 1.75 pulses per pixel.

Each of FIGS. 8A–8G represents an instantaneous snapshot of the state of an acoustic wave 140 used to modulate a beam portion 118 (FIG. 6) at a moment in time corresponding to the presence of a laser beam pulse. Thus, each of FIGS. 8A–8G are separated in time by between 3–50 nano seconds, and generally by about 12.5 nanoseconds, depending on the laser pulse repetition rate. In some embodiments of the invention, the width of a modulating active region 142 corresponds (after appropriate de-magnification by optics) to between 2–5 pixels to be imaged on substrate 40, and ideally to about 3 pixels As seen, the generation of an acoustic wave 140 in an acousto optic modulator is not instantaneous, but rather the acoustic wave 140 propagates across modulating active region 142 in a direction 156 at a rate that is a function of the physical properties of the material forming modulating active region 142. Moreover, as seen in FIGS. 8A–10G, the edge of the acoustic wave can be imaged onto a substrate by laser beam pulses, to form an edge of a feature to be written at a fixed position, even without filling the entire modulating active region 142. Typically an acoustic wave is suitable to be imaged to form an edge on a substrate, after beginning to propagate through modulating active region 142, in the space of less than one pixel, although in some embodiments a span of greater than 1 pixel may be required.

Reference is now made to FIGS. 9A–9G. In accordance with some embodiments of the present invention, an image 158 of modulating active region 142, which for simplicity of illustration is shown above a region being scanned, is scanned across substrate 40 at a velocity substantially equal and opposite in direction to the velocity of propagation of the imaged wave 140 in modulating active region 142. Ideally, there will be less than a ±25% difference in respective rates of progression and propagation. Scanning direction 124 is opposite to the direction 156 in which wave 140 propagates. As seen in FIGS. 9A–9G, a segment of a laser beam 160 is present in image 158. It is seen that segment 160 corresponds to the location of wave 140 in modulating active region 142, and the size of the spot of each flash varies over time as a function of the position and location of wave 140 in modulating active region 142. In the schematic representation shown in FIGS. 9A–9G, image 158 serves as a scanning window and acoustic wave 140 serves as an aperture that allows all or part of the window to be filled by an incoming laser beam. Pixels 146–152 are exposed by a succession of nearly instantaneous laser pulses. The region of substrate 40 exposed by a pulse is determined by the instantaneous location of image 158 and the segment 160 of the modulating acoustic wave 140 relative to substrate 40. The energy profile is determined by the overlap between the segment 160 and the laser beam profile 130 which is fixed relative to image 158.

It is appreciated by persons skilled in the art that the pictorial representation in FIGS. 9A–9G is schematic inasmuch as sharp edges are depicted. In actuality the size and profile of the spot formed by segment 160 which reaches substrate 40 are largely dictated by diffraction effects and optical aberrations of the system. Edge blurring occurring in the exposure process may be compensated in subsequent development processes of the photosensitive recording medium forming substrate 40 such that blurring as described hereinabove does not detract from the generality and validity of the foregoing schematic description.

Moreover, as appreciated by persons skilled in the art, inasmuch as the velocity of propagation of wave 140 and the velocity of scanning of image 158 are substantially equal but in opposite directions, front edge 162 and rear edge 164 of wave 140 substantially fix the location at which segment of laser beam 160 writes edges 166 and 168 of a run of pixels 144. It is noted that inasmuch as the velocity of image 158 is equal and opposite to the velocity of wave 140, the fixing of an edge is independent of the distance traversed by image 158 between flashes. Thus edges 166 and 168 are fixed irrespective of whether image 158 progresses between flashes by a whole number of pixels or any number of partial pixels.

Thus in accordance with some embodiments of the present invention, the location of a run of exposed pixels 144 is substantially independent of the average number of laser pulses by which a pixel 146–152 is exposed or any synchronization between the pulse repetition rate and velocity at which a beam or an image 158 is scanned. Thus pixels are exposed or not exposed as a function of the accumulated energy delivered to a pixel 146–152 by successive pulses.

Reference is now made to FIGS. 10A–10G which are energy graphs showing laser exposure energy profiles along run of pixels 144 corresponding to each of the stages of exposure shown in FIGS. 9A–9G. It is noted the region under no single curve 170–182 coincides with an individual pixel 146–152, however the region under all of the curves 170–182, taken together coincides with run of pixels 144 to be exposed. Moreover, summation of the individual exposure profiles 170–182 in FIG. 10G results in a substantially uniform level of energy provided to all of pixels 146–152 in run 144.

In summary, as seen in FIGS. 8A–10G, an acoustic wave 140 that modulates data propagates in the medium forming modulating active region 142 over a defined non-instantaneous interval of time; the presence and extent of the acoustic wave 140 in modulating active region 142 changes over time; and multiple pulses impinge on modulating active region 142 during the time that wave 140 is present therein such that the acoustic wave deflects to substrate 40 a laser beam segment 160 having a shape that changes according to the change in shape of wave 140 in modulating active region 142. Moreover, as seen in FIGS. 9A–9G, the region in a raster image exposed by each pulse partially overlaps regions exposed by previous pulses; the size of a segment of each pulse that is deflected by acoustic wave 162 varies as a function of its location in a pattern to be written, for example its proximity to an edge 166 and 168; the size of the region exposed by each pulse is smaller than the run of pixels to be exposed; a run of pixels is exposed by a plurality of pulses and each pulse exposes a region smaller than run of pixels; the total exposure of a run of pixels is the summation of the exposure by the plurality of mutually overlapping pulses.

Reference is now made to FIGS. 11A–11G which are simplified pictorial illustrations of an acoustic wave 140 at consecutive stages of generation thereof in the modulating active region 142 of an acousto-optical modulator crystal such as is associated with one of beam modulating channels 106 (FIG. 6); and to FIGS. 12A–12G which are simplified pictorial illustrations showing various stages, corresponding to stages shown in FIGS. 11A–11G, of exposure of a run of pixels 144, comprising pixels 146, 148, 150 and 152, on a substrate 40, such as a photoresist clad PCB, to be exposed in accordance with an embodiment of the present invention. Shading in run 144 indicates exposure by a laser beam pulse. FIGS. 11A–12G are generally similar to, and self explanatory, in view of the description with respect to FIGS. 8A–9G.

It is noted however that while FIGS. 11A–11G show the propagation of an acoustic wave 140 at times separated by the same intervals as in FIGS. 8A–8G, a laser pulse is present only at the times corresponding to stages shown in FIGS. 11A, 11C, 11E and 11G. Thus, the time interval between each of pulses in FIGS. 11A–11G is twice the time interval between pulses in FIGS. 8A–8G. It is thus seen that a laser beam segment 160 is present to expose part of run 144 only in images 158 shown in FIGS. 12A, 12C, 12E and 12G. Thus as shown in FIGS. 12A–12F, 4 pulses expose run 144, which comprises 4 pixels, while the integrity of the location of edges 166 and 168 in run 144 is maintained.

Reference is now made to FIGS. 13A–13G which are energy graphs showing accumulated laser energy along run of pixels 144 at each of the stages of exposure shown in FIGS. 12A–12G. FIGS. 13A–13G generally are similar to, and self explanatory, in view of the description with respect to FIGS. 10A–10G. It is noted however that although fewer pulses expose run 144, the accumulation of energy over run 144 is at least partially evened out by the overlapping of laser pulses. All parts of run 144 that exceed a minimum energy threshold will thus be exposed. It should be noted that some portions of the exposed area are exposed by more than one pulse and that the number of pulses that expose a portion may be as low as one, for some embodiments of the invention. It should also be noted that the portions may be exposed by different spatial regions on the pulse. These effects and the exposure necessary to expose a pixel may determine the lowest pulse rate which will result in satisfactory pattern writing.

Reference is now made to FIGS. 14A–14G which are simplified pictorial illustrations of an acoustic wave at consecutive stages of generation thereof in the modulating active region of an acousto-optical modulator such as is associated with one of beam modulating channels 106 (FIG. 6); and to FIGS. 15A–15G which are simplified pictorial illustrations showing various stages, corresponding to stages shown in FIGS. 14A–14G, of exposure of a run of pixels 144, comprising pixels 146, 148, 150 and 152, on a substrate 40, such as a photoresist clad PCB, to be exposed in accordance with an embodiment of the present invention. Shading in run 144 indicates exposure by a laser beam pulse.

FIGS. 14A–15G are generally similar to, and self explanatory, in view of the description with respect to FIGS. 8A–9G and FIGS. 11A–12G.

It is noted however that while FIGS. 14A–14G show the propagation of an acoustic wave 140 at times separated by the same intervals as in FIGS. 8A–8G, a laser pulse is present only at the times corresponding to stages shown in FIGS. 14B, 14D and 14F. Thus, the time interval between each of pulses in FIGS. 14A–14G is equal to the time interval in FIGS. 11A–11G and twice the time interval between pulses in FIGS. 8A–8G. It is thus seen that a laser beam segment 160 is present to expose part of run 144 only in images 158 shown in FIGS. 15B, 15D, and 15F. Thus as shown in FIGS. 15A–15F, although the time interval between pulses is the same as in FIGS. 11A–11G, the pulse timing is offset relative thereto such that only 3 pulses expose run 144. It is thus appreciated that in accordance with these embodiments of the present invention the integrity of the location of edges 166 and 168 in run 144 is maintained independently of the time interval between pulses and the time when a pulses arrives respective to the relative locations of image 158 and a run 144 of pixels to be exposed.

Reference is now made to FIGS. 16A–16G which are energy graphs showing laser energy profiles along run of pixels 144 at each of the stages of exposure shown in FIGS. 15A–15G. FIGS. 16A–16G are generally similar to, and self explanatory, in view of the description with respect to FIGS. 10A–10G and 13A–13G. It is noted however that although only three pulses expose run 144, the accumulation of energy over is at least partially evened out by the overlapping of laser pulses. All parts of run 144 that exceed a minimum energy threshold will thus be exposed.

It is noted that inasmuch as some portion of a pulse impinges on modulating active region 142 while front edge 162 or rear edge 164 of acoustic wave 140 is present therein, if the sum total of energy is sufficient to expose a pixel, then the location of edges 166 and 168 is generally insensitive to the time at which a pulse impinges thereon or the location of front edge 162 or rear edge in modulating medium 142.

It is appreciated that the limiting condition of exemplary embodiments described hereinabove operative to fix the edge of an exposing pulse relative to the edge of a run of pixels to be exposed, is the delivery of sufficient laser energy by multiple pulses to expose a pixel. Thus in accordance with some embodiments of the present invention a multi-channel modulator is employed to modulate separate portions 118 of beam 12 (FIG. 6), and subsequent scans of beam 12 are made to partially overlap previous scans on substrate 40. Each line of pixels to be exposed is thus addressed by a different channels in modulator 102 in at least two subsequent scan passes, such that in subsequent overlapping scans additional pulses are delivered to a run of pixels to be exposed to ensure a substantially even and sufficient quantity of laser energy is delivered to each pixel to be exposed.

Various configurations of apparatus to increase the pulse repetition rate of pulsed lasers and to write raster images using pulse lasers, as shown in FIGS. 1–5 are shown in the above referenced WO 00/11766.

Figure 17:
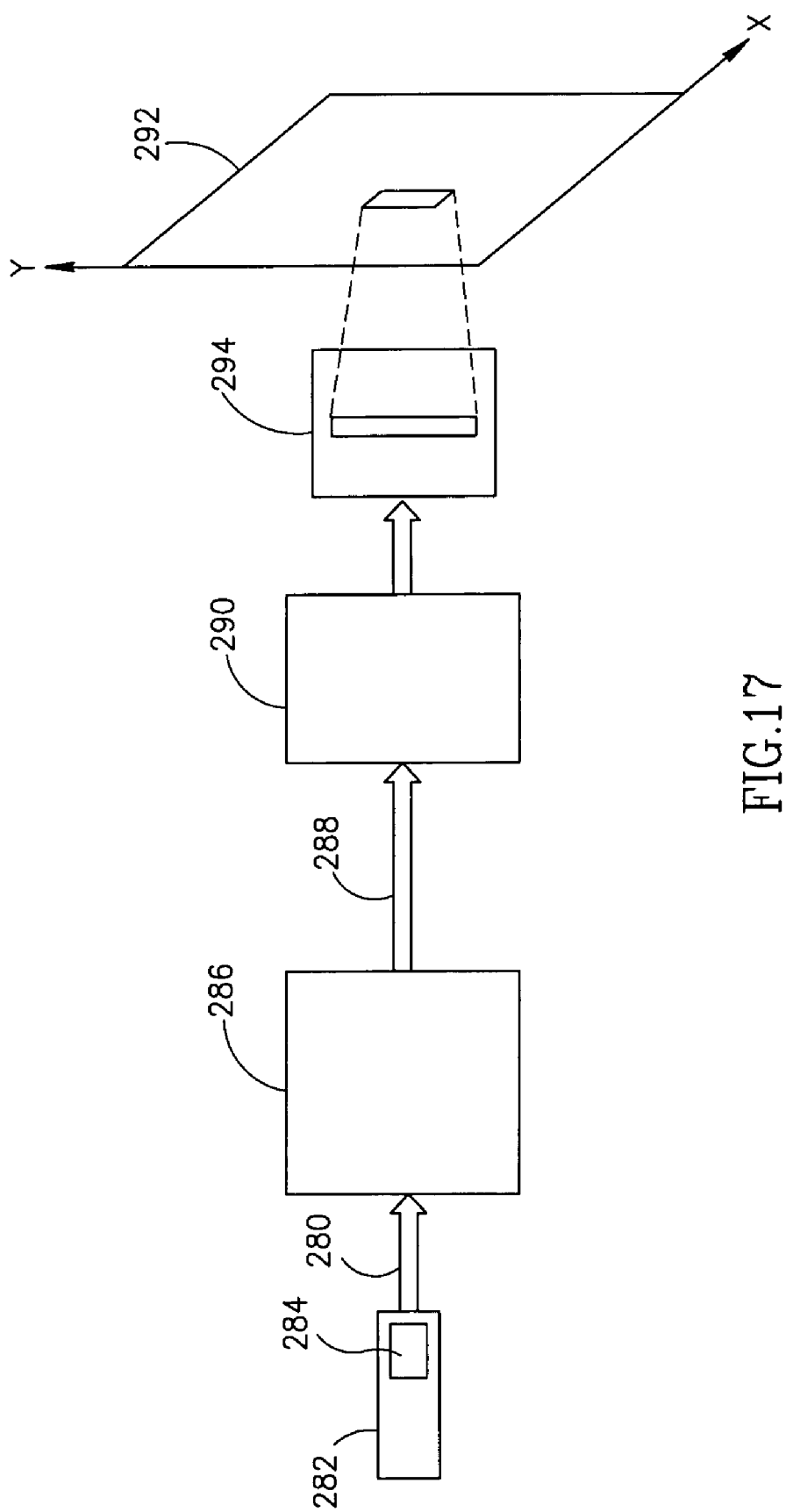
FIG. 17 is a schematic diagram showing the way some embodiments of the present invention are integrated in a PCB production line.

Reference is now made to FIG. 17 which is a schematic diagram illustrating integration of the present invention into a PCB production line. Linearly polarized and pulsed UV laser beam 280 is, for example, generated by a high power mode-locked IR laser 282 and passed through a frequency converter 284 operative to convert the frequency of laser 280 by harmonic generation. For example beam 280 is obtained from a Millennia laser, of Spectra Physics Lasers, at 532 nm wavelength which pumps a Tsunami mode-locked Ti:saphire laser also from Spectra-Physics Lasers. The output beam of the Tsunami mode-locked Ti:saphire laser is frequency doubled, for example by an LBO crystal, available from Fujian Casix Laser Inc. of China, external to the laser cavity, to about 390 nm. The repetition rate of the IR laser is, for example, about 82 MHz and its wavelength is around 780 nm. In accordance with some embodiments, the pulse repetition rate of UV beam 280 is multiplied (e.g. 2×, 4×, etc.) by a pulse rate multiplication device 286, such as pulse rate multiplication devices 50 and 215 described above. It is noted that other suitable high power pulsed lasers operative to frequency triple IR laser light to produce UV pulsed laser light are under development by Spectra-Physics of California. Output beam 288 exiting from device 286 impinges on an optical writing device 290, and is scanned across the surface of a photoresist clad PCB 292, used in the production of PCBs, by the joint action of a polygon mirror 294, in the direction of X and the lateral displacement of the PCB 292, in the direction of Y. In an exemplary embodiment, the beam 288 is spread into a line and portions thereof are independently modulated as described above. It is appreciated that if the data rate at which beam 288 is modulated by optical writing device 290 is sufficiently low compared to the pulse data rate of beam 288 the use of a pulse rate multiplication device 286 is obviated. This may occur for example if optical writing device simultaneously independently modulates a plurality of spatial portions of beam 280.

Thus, in some embodiments of the invention the pulse repetition rate of input beam 280 may vary between 80 MHz (for no repetition rate doubling) and 320 MHz for repetition rate quadrupling or more for greater multiplication, while the ratio of pulses to data may vary between an average 0.75 pulses (or less) to 8 pulses per pixel to be written. It is generally preferable to employ a modulator operative to fix an edge of a region to be written during exposure by multiple laser beam pulse, particularly when a low pulse to data ratio is used.

It will be clear to persons skilled in the art, that the scope of the present invention is not limited to the arrangements above described and sketched hereinabove, nor to pulsed UV laser beams. For example, pulse rate multiplication devices operating on basic principles according to some embodiments of the present invention may multiply the pulse repetition rate of any pulsed light beam; not only of pulsed lasers and not only of UV lasers.

Furthermore, the aspect of the invention that utilizes a quasi-CW modulation scheme as described above need not operate at UV and certainly need not utilize a frequency doubled laser. In a broad aspect of the invention, any use may be made of such quasi-CW modulated light, as for example scanning a surface or data transmission.

Furthermore, the present invention has been described using non-limiting detailed descriptions of exemplary embodiments thereof that are provided by way of example and that are not intended to limit the scope of the invention. Variations of embodiments of the invention, including combinations of features from the various embodiments will occur to persons of the art. The scope of the invention is thus limited only by the scope of the claims. Furthermore, to avoid any question regarding the scope of the claims, where the terms "comprise," "comprising," "include," "including" or the like are used in the claims, they mean "including but not necessarily limited to".

The invention claimed is:

1. Apparatus for exposing a pattern on a photosensitive surface comprising:
   a laser light source providing a beam formed of successive substantially instantaneous laser pulses separated by a time interval;
   a data signal source that provides data signals;
   a modulator that receives the beam and the data signals and selectively modulates the beam with a modulating signal responsive to the data signals for a time period longer than said time interval, such that the modulating signal is operative to modulate at least two successive pulses; and
   an optical subsystem that receives the modulated beam and projects an image of the modulator onto a photosensitive surface to expose a pattern thereon according to said modulating signal,
   wherein the modulating signal is an acoustic wave and wherein an attribute of the modulating signal changes between at least two successive pulses.

2. Apparatus according to claim 1 wherein the modulator is an acousto-optical modulator.

3. Apparatus according to claim 1 wherein the modulator has a defined length, and the attribute is the length of the acoustic wave in the modulator.

4. Apparatus according claim 3 and wherein the shape of a spot formed by a pulse in the beam, as projected by the optical subsystem, is at least partly defined by the length of the acoustic wave in the modulator.

5. Apparatus according to claim 3 and comprising a scanning subsystem for scanning the image of the modulator along the photosensitive surface.

6. Apparatus according to claim 5 wherein the acoustic wave propagates in the modulator at a first velocity having a first rate of propagation and a first direction, and the image of the modulator is scanned across the photosensitive surface at a velocity that is related to the velocity of propagation of the acoustic wave, but in the opposite direction.

* * * * *